United States Patent
Kirisawa

(10) Patent No.: US 8,228,737 B2
(45) Date of Patent: Jul. 24, 2012

(54) NONVOLATILE SEMICONDUCTOR MEMORY

(75) Inventor: Ryouhei Kirisawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 335 days.

(21) Appl. No.: 12/718,434

(22) Filed: Mar. 5, 2010

(65) Prior Publication Data

US 2010/0265770 A1    Oct. 21, 2010

(30) Foreign Application Priority Data

Apr. 16, 2009    (JP) .................................. 2009-100340

(51) Int. Cl.
*G11C 16/04* (2006.01)
(52) U.S. Cl. ......... 365/185.17; 365/185.18; 365/185.28; 257/315
(58) Field of Classification Search ............. 365/185.17, 365/185.18, 185.28; 257/315
See application file for complete search history.

(56) References Cited

U.S. PATENT DOCUMENTS

| 7,075,143 B2 * | 7/2006 | Fujiwara et al. .............. 257/324 |
| 2008/0186765 A1 | 8/2008 | Kamigaichi |

* cited by examiner

*Primary Examiner* — Hoai V Ho
(74) *Attorney, Agent, or Firm* — Oblon, Spivak, McClelland, Maier & Neustadt, L.L.P.

(57) ABSTRACT

A nonvolatile semiconductor memory comprising: a first semiconductor layer having a first stripe-shaped region and a second stripe-shaped region which is adjacent to the first stripe-shaped region; a first NAND string formed on the first stripe-shaped region, the first NAND string having a plurality of first memory cell transistors connected in series; a first insulating film formed above the second stripe-shaped region; a second semiconductor layer formed on the first insulating film; and a second NAND string formed on the second semiconductor layer, the second NAND string having a plurality of second memory cell transistors connected in series.

19 Claims, 20 Drawing Sheets

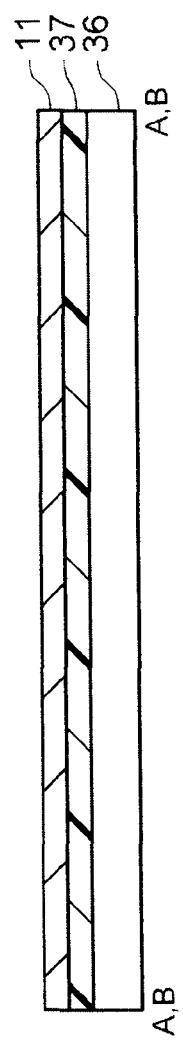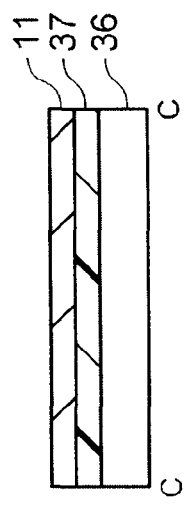
FIG. 3A
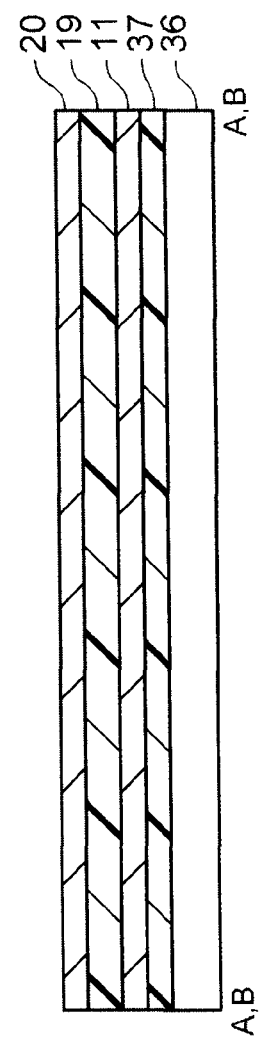
FIG. 3B

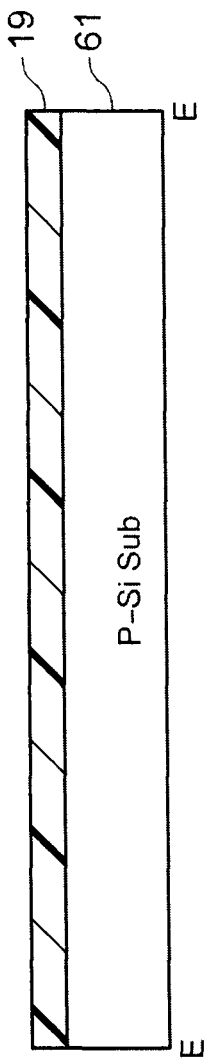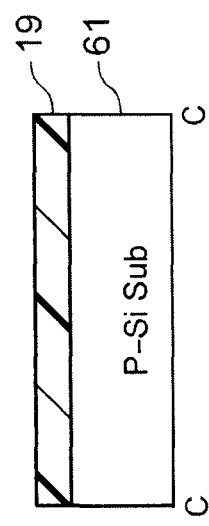
FIG. 8A
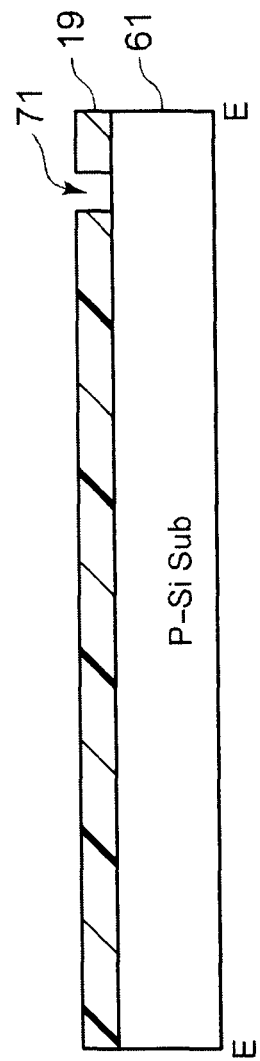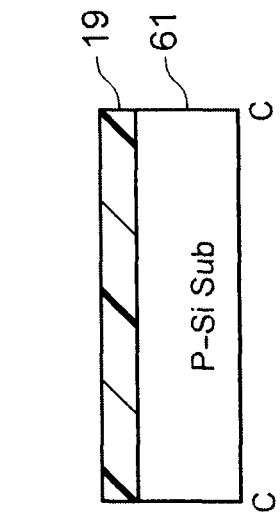
FIG. 8B

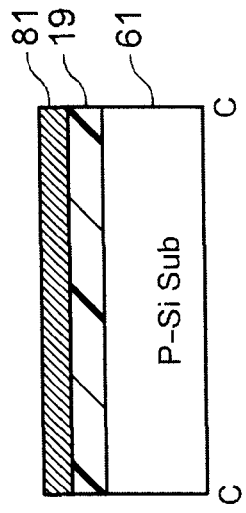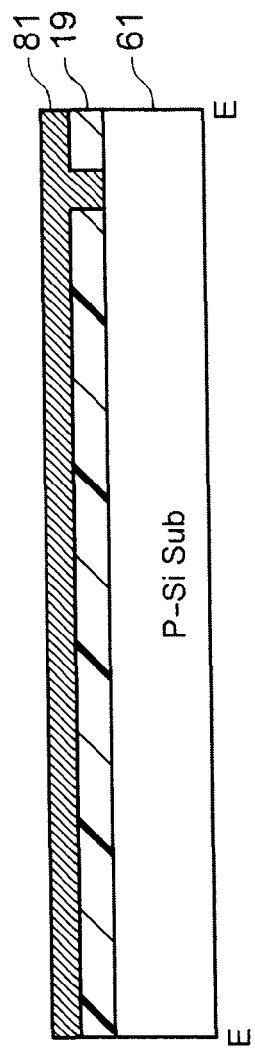
FIG. 8C
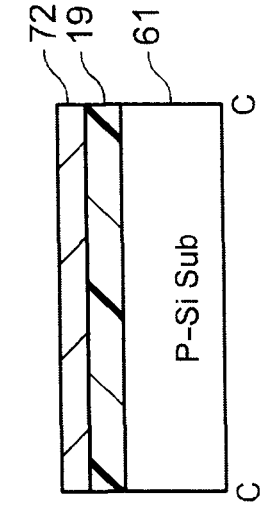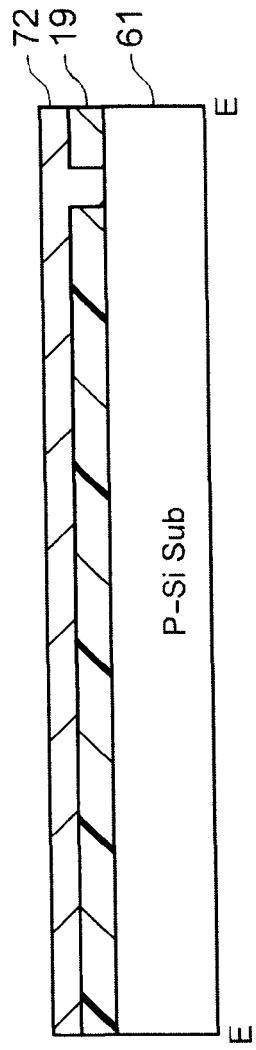
FIG. 8D

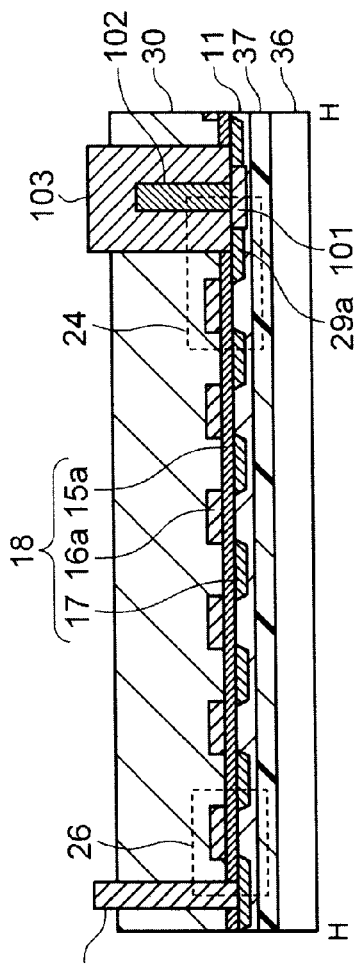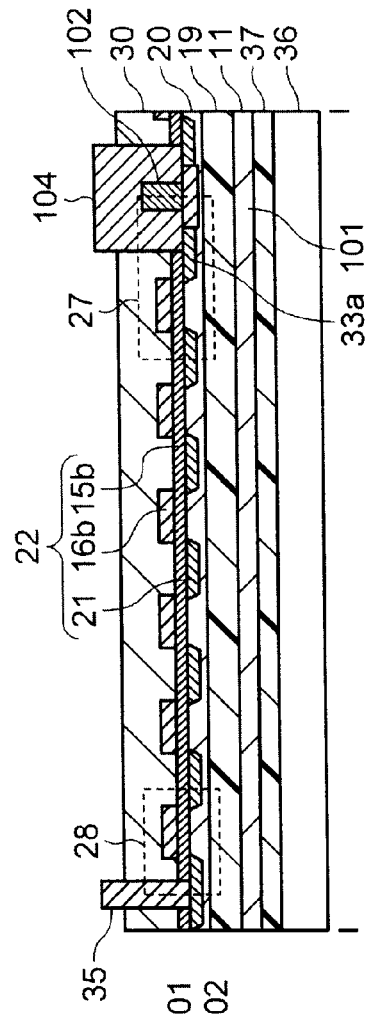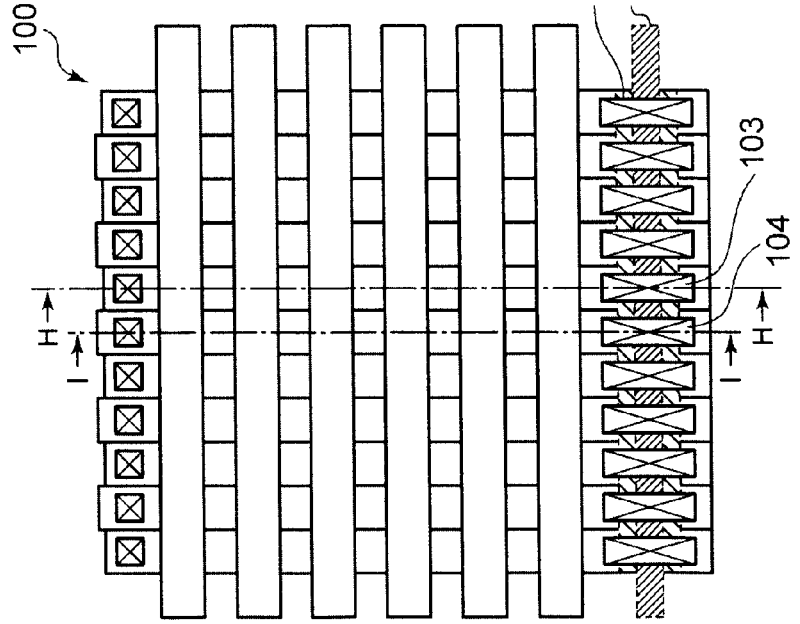

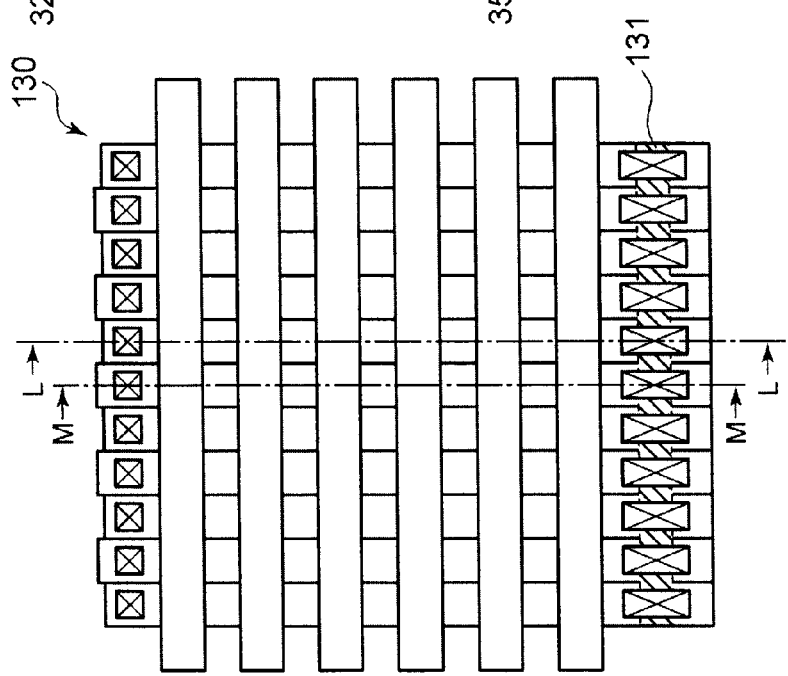
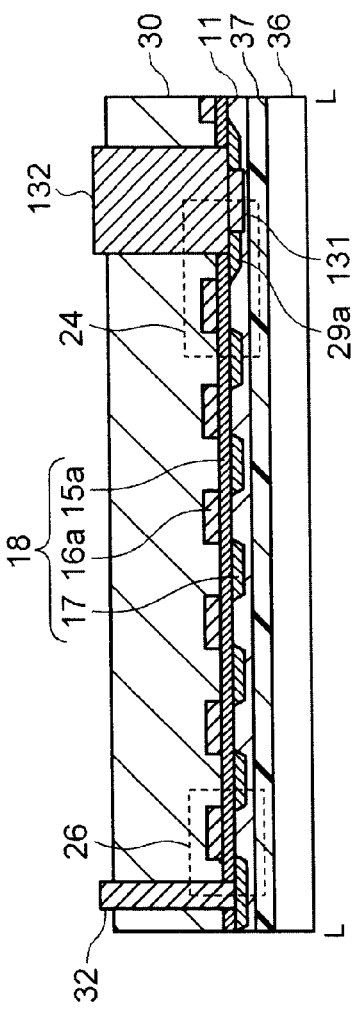
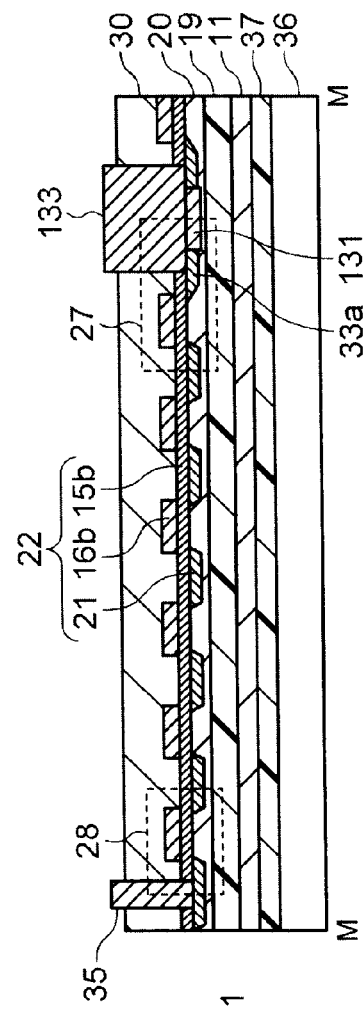

NONVOLATILE SEMICONDUCTOR MEMORY

CROSS-REFERENCE TO RELATED APPLICATION

This application is based upon and claims the benefit of priority from the prior Japanese Patent Application No. 2009-100340 filed in Japan on Apr. 16, 2009, the entire contents of which are incorporated herein by reference.

BACKGROUND OF THE INVENTION

1. Field of the Invention

The present invention relates to a nonvolatile semiconductor memory.

2. Description of the Related Art

An NAND-type flash electrically erasable programmable read only memory (EEPROM) is known as a nonvolatile semiconductor memory which is electrically rewritable, and which can be highly integrated (for example, see Japanese Patent Application Publication 2008-187051).

A nonvolatile semiconductor memory disclosed in the Patent Application Publication 2008-187051 has a memory cell array in which multiple NAND strings are arranged in an array. Each of the NAND strings is configured as follows. In each NAND string, multiple memory cell transistors are connected together in series. Each of the memory cell transistors is formed of an N-channel MOS transistor including a floating gate electrode and a control gate electrode stacked one on the other. The drain of an endmost one of the multiple cell transistors is connected to a bit line by a bit line contact via a selection N-channel metal oxide semiconductor (MOS) transistor. The source of the other-endmost one of the multiple cell transistors is connected to a source line by a source line contact via another selection N-channel MOS transistor.

When data is written to the nonvolatile semiconductor memory, a high voltage is applied to control gate electrodes respectively of selected memory cell transistors, whereas an intermediate voltage is applied to NAND strings which include non-selected memory cell transistors. For this reason, an inversion voltage between the NAND strings needs to be set higher. To this end, as an element isolating layer, a shallow trench isolation (STI) is formed between each two adjacent NAND strings. The STI is made by filling an insulating material into its trench.

The element isolating capability of the STIs in the nonvolatile semiconductor memory disclosed in the Patent Application Publication 2008-187051 depends on the distance between the two adjacent elements (memory cells), namely the width of the element isolation insulating film (the width of the trench), and the depth of the element isolation insulating film (the depth of the trench).

When the width of the element isolation insulating film is narrowed for miniaturizing the nonvolatile semiconductor memory, the depth of the element isolation insulating film needs to be made deeper for securing a sufficient element isolating capability. This means that the aspect ratio of the trench needs to be increased. The increase in the aspect ratio makes it very difficult to fulfill an etching process, a process for filling the insulating material into the trench, and the like when the trench is formed.

This makes it difficult to narrow the pitch of the NAND strings, and thus causes a problem of difficulty in high integration and high storage capacity.

SUMMARY OF THE INVENTION

According to an aspect of the invention, there is provided a nonvolatile semiconductor memory comprising: a first memory cell transistor including a first control gate electrode and first source/drain impurity diffusion layers, the first control gate electrode being formed on a main surface of a first semiconductor layer of a first conductivity type with a first electric charge accumulating portion being interposed in between, the first source/drain impurity diffusion layers being of a second conductivity type and being formed to sandwich the first control gate electrode in between; and a second memory cell transistor including a second control gate electrode and second source/drain impurity diffusion layers, the second control gate electrode being formed on a main surface of a second semiconductor layer of the first conductivity type, the second source/drain impurity diffusion layers being of the second conductivity type and being formed to sandwich the second control gate electrode in between, the second semiconductor layer being formed on the first semiconductor layer with an insulating film being interposed in between in an area other than that in which the first memory cell transistor is formed, the insulating film being thicker than the first electric charge accumulating portion.

According to an aspect of the invention, there is provided a nonvolatile semiconductor memory comprising a first NAND string and a second NAND string, the first NAND string including first memory cell transistors and paired first selection transistors, the first memory cell transistors being connected together in series and each including a first control gate electrode formed on a main surface of a first semiconductor layer of a first conductivity type with a first electric charge accumulating portion being interposed in between, the paired first selection transistors being connected to endmost ones of the first memory cell transistors, respectively, the second NAND string including second memory cell transistors and paired second selection transistors, the second memory cell transistors being connected together in series and each including a second control gate electrode formed on a main surface of a second semiconductor layer of the first conductivity type with a second electric charge accumulating portion being interposed in between, the paired second selection transistors connected to endmost ones of the second memory cell transistors, respectively, the second semiconductor layer being formed on the first semiconductor layer with an insulating film being interposed in between in an area other than that in which the first semiconductor layer is formed, the insulating film being thicker than the first electric charge accumulating portion, wherein the first control gate electrode and the second control gate electrode are formed of a single body, and a first selection gate electrode of the first selection transistor and a second selection gate electrode of the second selection transistor are formed of a single body.

According to an aspect of the invention, there is provided a nonvolatile semiconductor memory comprising: a first semiconductor layer having a first stripe-shaped region and a second stripe-shaped region which is adjacent to the first stripe-shaped region; a first NAND string formed on the first stripe-shaped region, the first NAND string having a plurality of first memory cell transistors connected in series; a first insulating film formed above the second stripe-shaped region; a second semiconductor layer formed on the first insulating film; and a second NAND string formed on the second semiconductor layer, the second NAND string having a plurality of second memory cell transistors connected in series.

BRIEF DESCRIPTION OF THE DRAWINGS

FIG. 1A is a plan view of the nonvolatile semiconductor memory. FIG. 1B is a cross-sectional view taken along the A-A line of FIG. 1A, which is viewed in a direction indicated by arrows A. FIG. 1C is another cross-sectional view taken along the B-B line of FIG. 1A, which is viewed in a direction indicated by arrows B. FIG. 1D is yet another cross-sectional view taken along the C-C line, which is viewed in a direction indicated by arrows C.

FIG. 2A is a diagram showing the nonvolatile semiconductor memory according to the present embodiment, and FIG. 2B is a diagram showing the nonvolatile semiconductor memory according to the comparative example.

FIGS. 3A to 3C are cross-sectional views showing steps in manufacturing the nonvolatile semiconductor memory according to Embodiment 1 of the present invention in the manufacturing sequence.

FIG. 7A is a plan view of the nonvolatile semiconductor memory. FIG. 7B is a cross-sectional view taken along the D-D line of FIG. 7A, which is viewed in a direction indicated by arrows D. FIG. 7C is another cross-sectional view taken along the E-E line of FIG. 7A, which is viewed in a direction indicated by arrows E.

FIGS. 8A to 8D are diagrams showing main steps in manufacturing the nonvolatile semiconductor memory according to Embodiment 3 of the present invention in the manufacturing sequence.

FIG. 9A is a plan view of the nonvolatile semiconductor memory. FIG. 9B is a cross-sectional view taken along the F-F line of FIG. 9A, which is viewed in a direction indicated by arrows F. FIG. 9C is another cross-sectional view taken along the G-G line of FIG. 9A, which is viewed in a direction indicated by arrows G.

FIGS. 10A to 10O are diagrams showing a nonvolatile semiconductor memory according to Embodiment 4 of the present invention. FIG. 10A is a plan view of the nonvolatile semiconductor memory. FIG. 10B is a cross-sectional view taken along the H-H line of FIG. 10A, which is viewed in a direction indicated by arrows H. FIG. 10C is another cross-sectional view taken along the I-I line of FIG. 10A, which is viewed in a direction indicated by arrows I.

FIG. 11A is a plan view of the nonvolatile semiconductor memory. FIG. 11B is a cross-sectional view taken along the J-J line of FIG. 11A, which is viewed in a direction indicated by arrows J. FIG. 11C is another cross-sectional view taken along the K-K line of FIG. 11A, which is viewed in a direction indicated by arrows K.

FIGS. 13A to 13C are diagrams showing a nonvolatile semiconductor memory according to Embodiment 6 of the present invention. FIG. 13A is a plan view of the nonvolatile semiconductor memory. FIG. 13B is a cross-sectional view taken along the L-L line of FIG. 13A, which is viewed in a direction indicated by arrows L. FIG. 13C is another cross-sectional view taken along the M-M line of FIG. 13A, which is viewed in a direction indicated by arrows M.

FIG. 14A is a plan view of the nonvolatile semiconductor memory. FIG. 14B is a cross-sectional view taken along the N-N line of FIG. 14A, which is viewed in a direction indicated by arrows N. FIG. 14C is another cross-sectional view taken along the O-O line of FIG. 14A, which is viewed in a direction indicated by arrows O.

DETAILED DESCRIPTION OF THE INVENTION

Figure 1A:
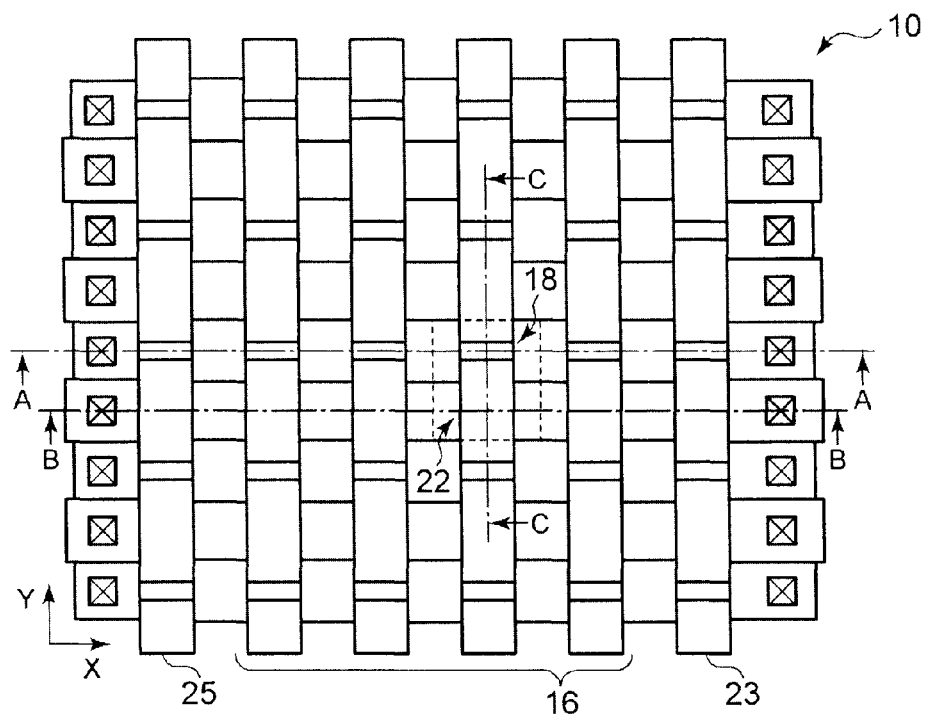
FIGS. 1A to 1D are diagrams showing a nonvolatile semiconductor memory according to Embodiment 1 of the present invention.

Hereinafter, embodiments of the present invention will be described with reference to the drawings. The same reference numerals will be given to the same or equivalent portions in the drawings, and description thereof will not be repeated.

Embodiment 1

Descriptions will be provided for a nonvolatile semiconductor memory according to Embodiment 1 of the present invention by use of FIGS. 1A to 5B. FIGS. 1A to 1D are diagrams showing the nonvolatile semiconductor memory. FIG. 1A is a plan view of the nonvolatile semiconductor memory. FIG. 1B is a cross-sectional view taken along the A-A line of FIG. 1A, which is viewed in a direction indicated by arrows A. FIG. 1C is another cross-sectional view taken along the B-B line of FIG. 1A, which is viewed in a direction indicated by arrows B. FIG. 1D is yet another cross-sectional view taken along the C-C line, which is viewed in a direction indicated by arrows C. FIGS. 2A to 2B are diagrams showing the nonvolatile semiconductor memory as compared with a comparative example. FIG. 2A is a diagram showing the nonvolatile semiconductor memory according to the present embodiment. FIG. 2B is a diagram showing the nonvolatile semiconductor memory according to the comparative example. FIGS. 3A to 5B are cross-sectional views of steps in manufacturing the nonvolatile semiconductor memory in the manufacturing sequence.

The nonvolatile semiconductor memory according to the present embodiment is an example of an NAND-type EEPROM including NAND strings. Each NAND string includes multiple memory cell transistors which are connected together in series while each two adjacent memory cell transistors share one source/drain impurity diffusion layer between the two adjacent memory transistors. Each memory transistor cell includes an electric charge accumulating layer.

As shown in FIGS. 1A to 1D, a nonvolatile semiconductor memory 10 according to the present embodiment includes first memory cell transistors 18 on a main surface of a P-type (first conductivity type) first semiconductor layer 11. Each first memory cell transistor 18 includes a first control gate electrode 16a and N-type (second conductivity type) first source/drain impurity diffusion layers 17. The first control gate electrode 16a is formed on the main surface of the first semiconductor layer 11 with a first electric charge accumulating portion 15a being interposed in between. The first source/drain impurity diffusion layers 17 are formed with the first control gate electrode 16a being interposed in between. The first electric charge accumulating portion 15a is made by laminating a tunnel oxide film 12, an electric charge accumulating layer 13 and an oxide film 14 together in this order.

The nonvolatile semiconductor memory 10 further includes second memory cell transistors 22 on a main surface of a P-type second semiconductor layer 20. Each second memory cell transistor 22 includes a second control gate electrode 16b and N-type second source/drain impurity diffusion layers 21. The second control gate electrode 16b is formed on the main surface of the second semiconductor layer 20 with a second electric charge accumulating portion 15b being interposed in between. The second source/drain impurity diffusion layers 21 are formed with the second control gate electrode 16b being interposed in between. The second semiconductor layer 20 is formed on the first semiconductor layer 11, in an area other than that in which the respective first memory cell transistors 18 are formed, with an insulating film 19 being interposed in between. The insulating film 19 is thicker than the first electric charge accumulating portion 15a. The second electric charge accumulating portion 15b is formed by laminating the tunnel oxide film 12, the electric charge accumulating layer 13 and the oxide film 14 together in this order.

In addition, first NAND strings are each formed as follows. Multiple first memory cell transistors 18 are connected together in series while each two adjacent first memory cell transistors 18 share one first source/drain impurity diffusion layer 17 existing between the two adjacent first memory cell transistors 18. A first selection transistor 24 including a first selection gate electrode 23a is connected to an endmost first memory cell transistor 18 on a source side of the first NAND string. A first selection transistor 26 including a first selection gate electrode 25a is connected to an endmost first memory cell transistor 18 on a drain side of the first NAND string.

Similarly, second NAND strings are each formed as follows. Multiple second memory cell transistors 22 are connected together in series while each two adjacent second memory cell transistors 22 share one second source/drain impurity diffusion layer 21 existing between the two adjacent second memory cell transistors 22. A second selection transistor 27 including a second selection gate electrode 23b is connected to an endmost second memory cell transistor 22 on a source side of the second NAND string. A second selection transistor 28 including a second selection gate electrode 25b is connected to an endmost second memory cell transistor 22 on a drain side of the second NAND string.

A memory cell array is made by alternately arranging the first NAND string and the second NAND string.

In this respect, the first control gate electrode 16a and the second control gate electrode 16b are formed of a single body; the first selection gate electrode 23a and the second selection gate electrode 23b are formed of a single body; and the first selection gate electrode 25a and the second selection gate electrode 25b are formed of a single body.

Hereinafter, the first control gate electrode 16a and the second control gate electrode 16b will be commonly referred to as a "control gate electrode 16"; the first selection gate electrode 23a and the second selection gate electrode 23b will be referred to as a "selection gate electrode 23"; and the first selection gate electrode 25a and the second selection gate electrode 25b will be referred to as a "selection gate electrode 25."

A source contact 31, which penetrates an interlayer dielectric 30, is connected to a source impurity diffusion layer 29a in each first selection transistor 24. A drain contact 32, which penetrates the interlayer dielectric 30, is connected to a drain impurity diffusion layer 29b in each first selection transistor 26.

Similarly, a source contact 34, which penetrates the interlayer dielectric 30, is connected to a source impurity diffusion layer 33a in each second selection transistor 27. A drain contact 35, which penetrates the interlayer dielectric 30, is connected to a drain impurity diffusion layer 33b in each second selection transistor 28.

The first semiconductor layer 11 is a polycrystalline silicon layer formed on an insulating film 37 which is formed on a main surface of a silicon substrate 36 as a supporting base. Similarly, the second semiconductor layer is a polycrystalline silicon layer formed on the insulating film 19.

Each first memory cell transistor 18 and each second memory cell transistor 22 are N-channel insulating gate field-effect transistors (MOS transistors) formed on the respective polycrystalline silicon layers. Each of the first memory cell transistors 18 and the second memory cell transistors 22 has a metal oxide nitride oxide silicon (MONOS) structure which is configured to store information by using a change in a threshold value. The change occurs when a high voltage is applied to its control gate electrode 16, and electrons thus pass the tunnel insulating film 12 and are thereby injected into the electric charge accumulating layer 13.

The second memory cell transistors 22 are formed in a location which is higher than that of the first memory cell transistors 18 above the main surface of the silicon substrate 36. Elements as the first memory cell transistors 18 and elements as the second memory cell transistors 22 are isolated from each other by the insulating film 19 in a direction perpendicular to the main surface of the silicon substrate 36.

In short, the nonvolatile semiconductor memory 10 is a nonvolatile semiconductor memory having what is termed as a three-dimensional structure. The nonvolatile semiconductor memory 10 includes the first memory cell transistors 18 and the second memory cell transistors 22 which are arranged so as to be located on different planes, respectively, and so as to have their flat shapes alternately adjacent one to another.

Figure 2A:
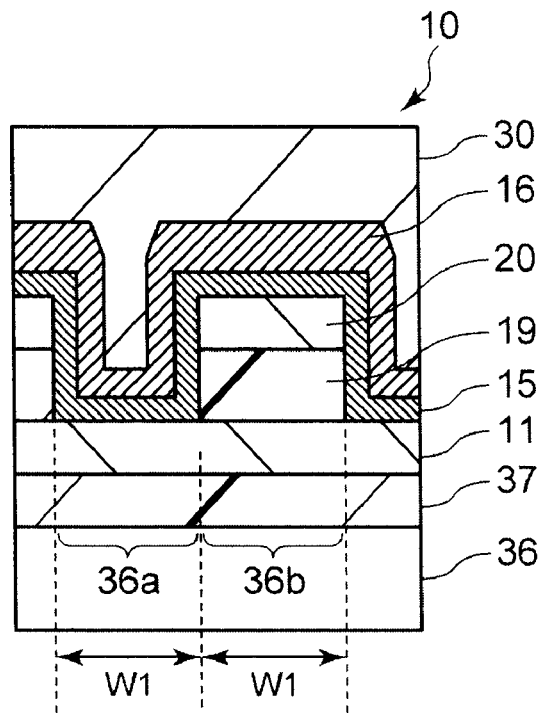
FIGS. 2A and 2B are diagrams showing the nonvolatile semiconductor memory according to Embodiment 1 of the present invention as compared with a comparative example.
Figure 2B:
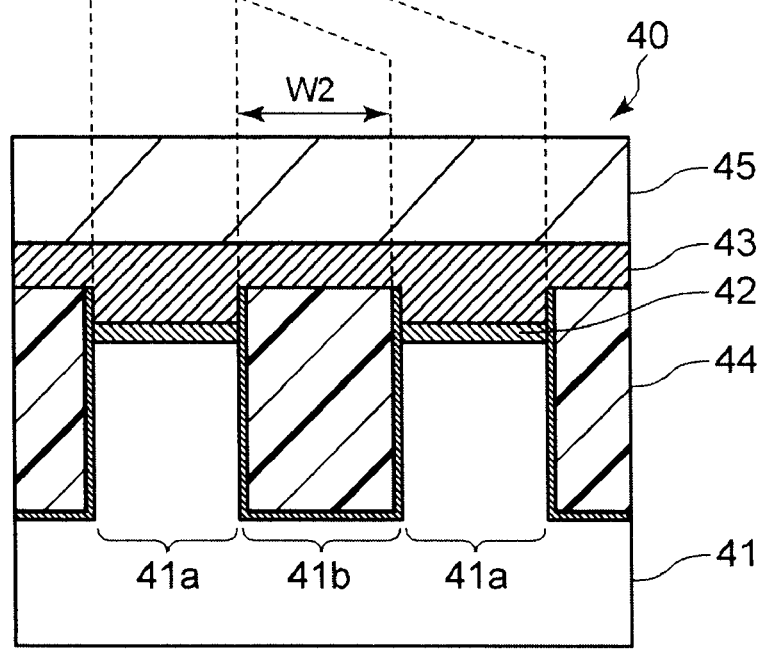

FIGS. 2A and 2B are diagrams showing the nonvolatile semiconductor memory 10 as compared with a comparative example. FIG. 2A is a cross-sectional view showing the nonvolatile semiconductor memory according to the present embodiment. FIG. 2B is a cross-sectional view showing the nonvolatile semiconductor memory as the comparative example.

In this respect, the comparative example is a nonvolatile semiconductor memory in which memory cell transistors each having a MONOS structure are arranged in a direction in parallel to the main surface of the substrate with an element isolating region being interposed between each two adjacent memory cell transistors. Descriptions start with the comparative example.

As shown in FIG. 2B, the nonvolatile semiconductor memory 40 as the comparative example has mutually-adjacent element regions 41a and element isolating regions 41b, in a semiconductor substrate 41. A memory cell transistor is formed in each element region 41a. The memory cell transistor includes an electric charge accumulating portion 42, a control gate electrode 43 and a source/drain impurity diffusion layer, which is not illustrated. An element isolating layer (STI) 44 is formed in each element isolating region 41b.

Each two adjacent element regions 41a are arranged in the direction in parallel to the main surface of the semiconductor substrate 41 with one element isolating region 41b being interposed in between. This arrangement requires its arrangement pitch to be equal to a sum of the widths (W1) of the respective element regions 41a and the width (W2) of the element isolating region 41b.

By contrast, the nonvolatile semiconductor memory 10 according to the present embodiment includes element regions 36a which are adjacent to one another. In each two adjacent element regions 36a, the first memory cell transistor 18 is formed in one element region 36a, whereas the second memory cell transistor 22 is formed in the other element region 36a. The first memory cell transistor 18 includes the first electric charge accumulating portion 15a, the first control gate electrode 16a and the first source/drain impurity diffusion layer 17. The second memory cell transistor 22 includes the second electric charge accumulating portion 15b, the second control gate electrode 16b and the second source/drain impurity diffusion layer 21.

The adjacent element regions 36a including the first and second memory cell transistors 18, 22 are arranged in a location lower than the insulation film 19, which functions as the element isolating layer, and in a location higher than the insulating film 19. The first and second memory cell transistors 18, 22 have their flat shapes which are adjacent to each other in a direction in parallel with the main surface of the silicon substrate 36. For this reason, the first and second memory cell transistors 18, 22 need no element isolating region in parallel with the main surface of the silicon substrate 36. Accordingly, each arrangement pitch is determined by only the widths (W1) of the two adjacent element regions 36a in the channel direction Y.

In short, it is possible to make the interstice between each two adjacent element regions narrower in the nonvolatile semiconductor memory 10 according to the present embodiment than in the nonvolatile semiconductor memory 40 as the comparative example.

The nonvolatile semiconductor memory 10 achieves its erasing operation as follows. A high voltage is applied to the drain, source and gate of each selection transistor, whereas a ground or low voltage is applied to each control gate electrode. Thereby, the multiple memory cell transistors simultaneously discharge electrons from their respective electric charge accumulating layers to the channel. Otherwise, positive electric charges are injected from the N-type diffusion layer or the channel to the electric charge accumulating layer of each memory cell transistor at a time.

The nonvolatile semiconductor memory 10 achieves its writing operation as follows. The high voltage is applied to the control gate electrode of each selected memory cell transistor. The low voltage is applied to non-selected control gate electrodes and bit-line side selection gate electrodes. The ground voltage is applied to non-selected source-line side selection gate electrodes. In each NAND string which includes the selected memory cell transistor(s), the ground voltage is applied to the drain of the bit-line side selection transistor, whereas the ground or low voltage is applied to the source of the source-line side selection transistors.

Thereby, electrons are injected to the electric charge accumulating layer of each selected memory cell transistor. Otherwise, positive electric charges are discharged from the electric charge accumulating layer. In addition, when an intermediate voltage is applied to the non-selected NAND strings, the high voltage applied to the selected control gate electrodes can be eased. This makes it possible to prevent a wrong writing operation.

In the above-described case, the nonvolatile semiconductor memory 10 achieves the erasing operation by applying the high voltage to the drain, source, and gate of each selection transistor. However, the nonvolatile semiconductor memory 10 may apply a negative high voltage to each control gate electrode. In this case, the ground voltage is applied to the drain and source electrodes of each selection transistor, whereas a voltage higher than the threshold value of the selection transistors is applied to the selection gate electrodes.

Next, descriptions will be provided for a method of manufacturing the nonvolatile semiconductor memory 10. FIGS. 3A to 5B are cross-sectional views showing steps in manufacturing the nonvolatile semiconductor memory 10 in the manufacturing sequence.

First of all, as shown in FIG. 3A, as the insulating film 37, a silicon oxide film with a thickness of approximately 500 nm is formed on the silicon substrate 36 of the P type or the N type, for instance, by thermal oxidation.

Subsequently, as the first semiconductor layer 11, a P-type polysilicon film with a thickness of approximately 500 nm and with B (boron) added thereto is formed on the insulating film 37, for instance, by chemical vapor deposition (CVD).

Thereafter, as shown in FIG. 3B, as the insulating film 19, a silicon oxide film with a thickness of approximately 300 nm is formed on the first semiconductor layer 11, for instance, by CVD.

Afterward, as the second semiconductor layer 20, a P-type polysilicon film with a thickness of approximately 500 nm and with B (boron) added thereto is formed on the insulating film 19, for instance, by CVD.

Figure 3C:
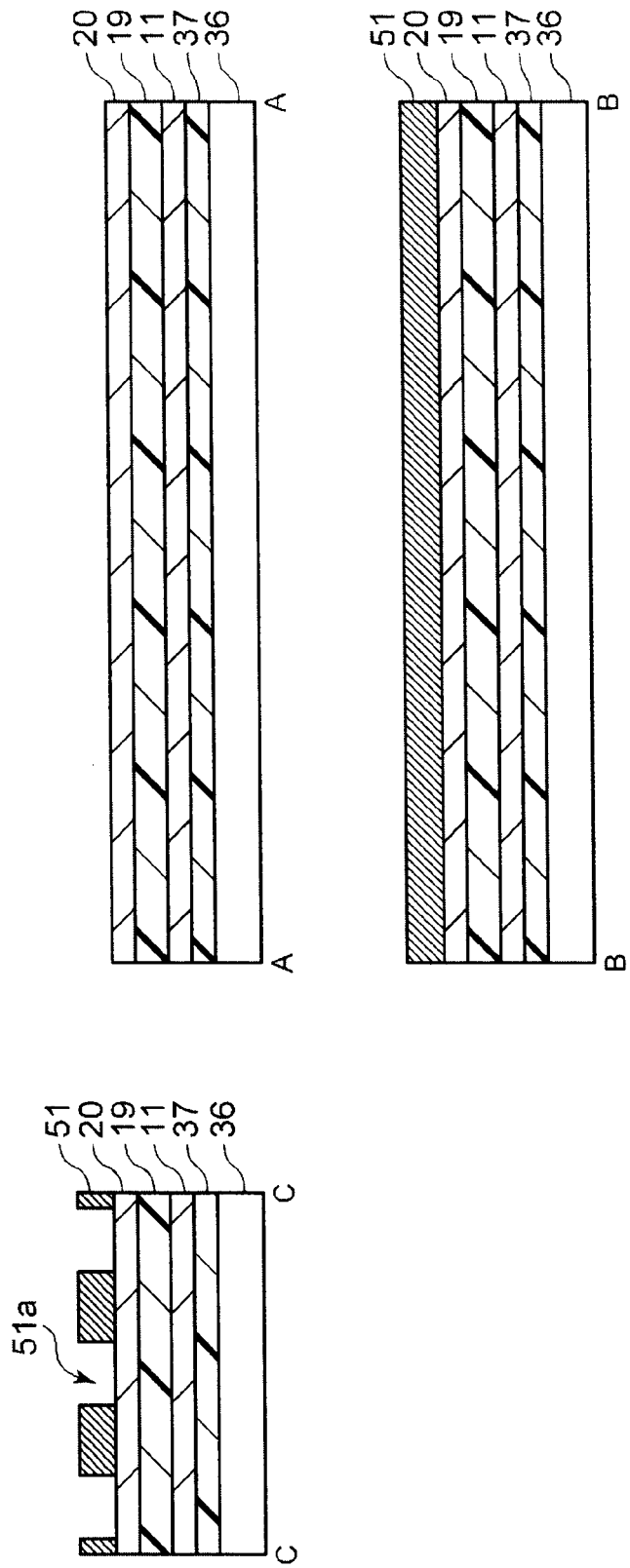

Subsequently, as shown in FIG. 3C, a mask material 51 is formed on the second semiconductor layer 20 by photolithography. The mask material 51 includes stripe-shaped openings 51a corresponding to the first source/drain impurity diffusion layers 17 and the second source/drain impurity diffusion layers 21

To put it concretely, a silicon oxide film and a silicon nitride film are formed on the second semiconductor layer 20. Thereafter, the resist film is patterned by photolithography. Afterward, the silicon nitride film and the silicon oxide film are sequentially etched by reactive ion etching (RIE) using the resist film as the mask. Thereby, portions of the second semiconductor layer 20 are exposed to the outside.

Figure 4A:
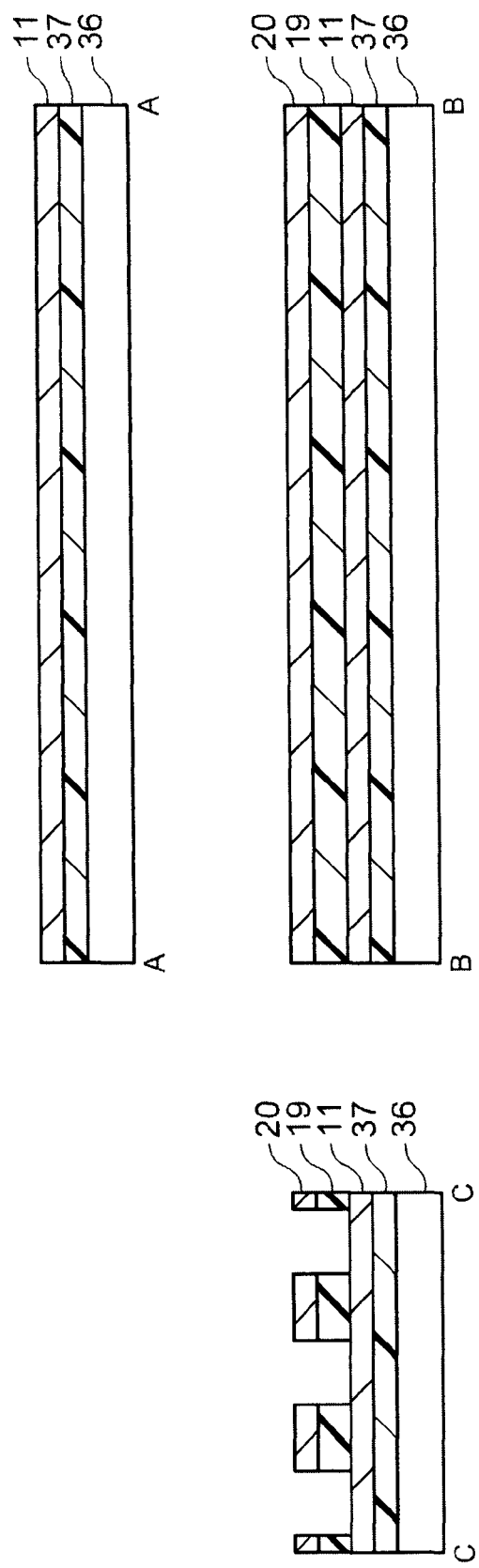
FIGS. 4A and 4B are cross-sectional views showing ensuing steps in manufacturing the nonvolatile semiconductor memory according to Embodiment 1 of the present invention in the manufacturing sequence.

After that, as shown in FIG. 4A, by use of the mask material 51, the second semiconductor layer 20 is etched, for instance, by RIE using a chlorine-based/fluorine-based gas. Subsequently, the insulating film 19 is etched by RIE using a fluorine-based gas. Thereby, portions of the first semiconductor layer 11 are exposed to the outside. By this, the second semiconductor layer 20 is separated into stripe-shaped portions which extend in the channel length direction X.

Figure 4B:
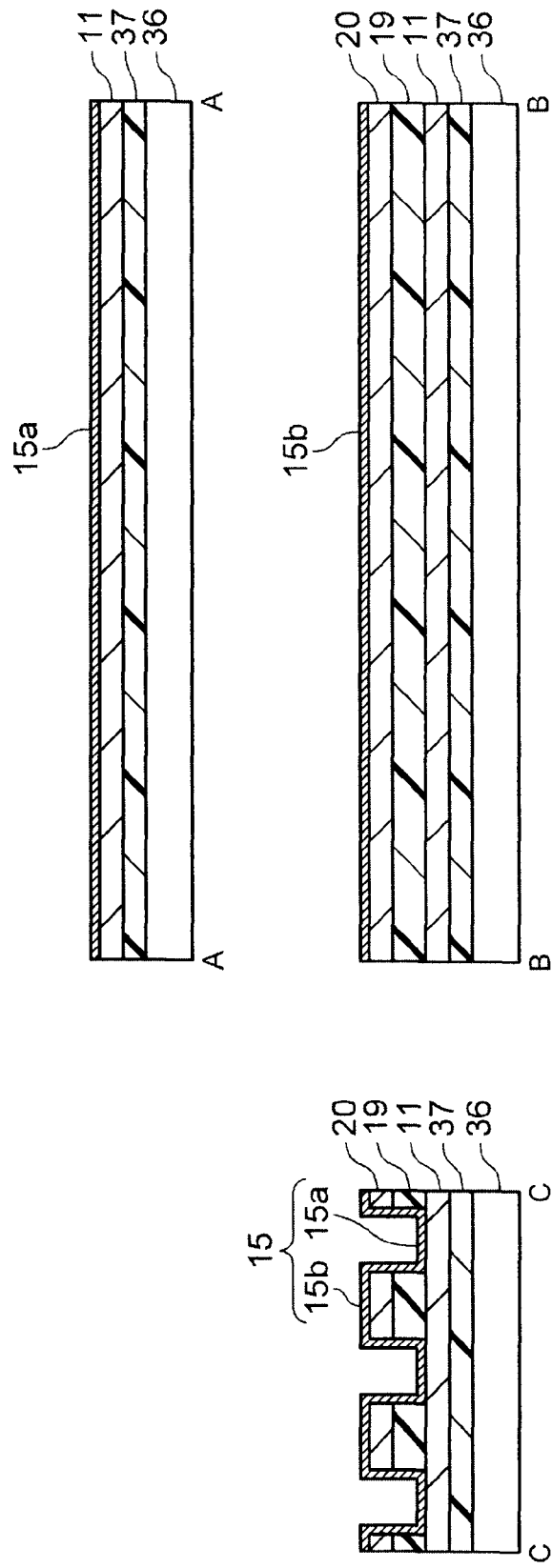

Subsequently, as shown in FIG. 4B, the tunnel oxide film 12, the electric charge accumulating layer 13 and the oxide film 14 are sequentially stacked one on another so as to conformally cover a top surface and side surfaces of each remaining portion of the second semiconductor layer 20, side surfaces of each remaining portion of the insulating film 19 and a top surface of each exposed portion of the first semiconductor layer 11. Thereby, the electric charge accumulating portion 15 is formed.

To put it concretely, the tunnel oxide film 12 is an oxynitride film obtained through the following procedure. A silicon nitride film is formed on each remaining exposed portion of the first semiconductor layer 11 and each exposed portion of the second semiconductor layer 20 by thermal oxidation, for instance. Subsequently, a nitriding treatment is applied to this silicon nitride film by use of a $NH_3$ gas. Thereafter, an oxidizing treatment is further applied to the resultant silicon nitride film. Thereby, the oxynitride film is obtained. The electric charge accumulating layer 13 is a silicon nitride film formed by plasma CVD, for instance. The oxide film 14 is a silicon oxide film formed by CVD, for instance.

Figure 5A:
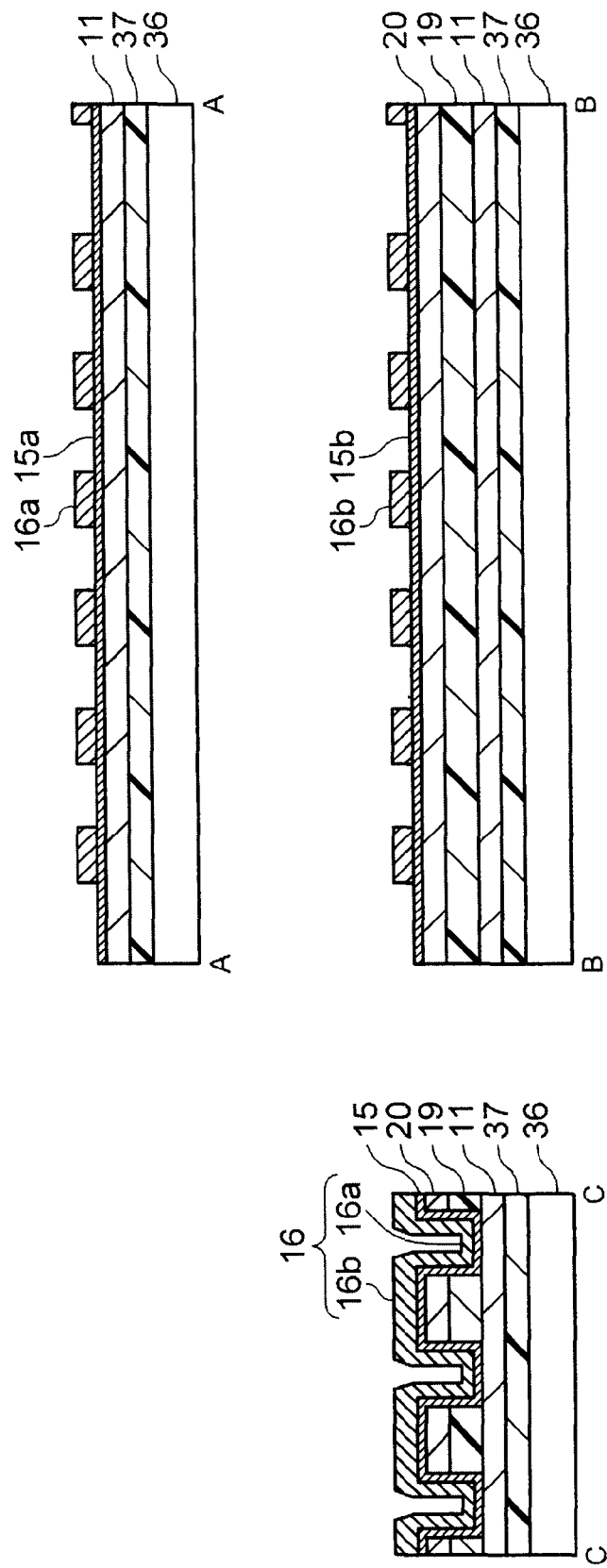
FIGS. 5A and 5B are cross-sectional views showing further ensuing steps in manufacturing the nonvolatile semiconductor memory according to Embodiment 1 of the present invention in the manufacturing sequence.

Thereafter, as shown in FIG. 5A, as the control gate electrode 16, an N-type polysilicon film, to which P (phosphorus)

is added, is formed on the oxide film 14 by CVD, for instance. Afterward, the N-type polysilicon film is patterned into stripe shapes extending in the channel width direction Y by photolithography.

Figure 5B:
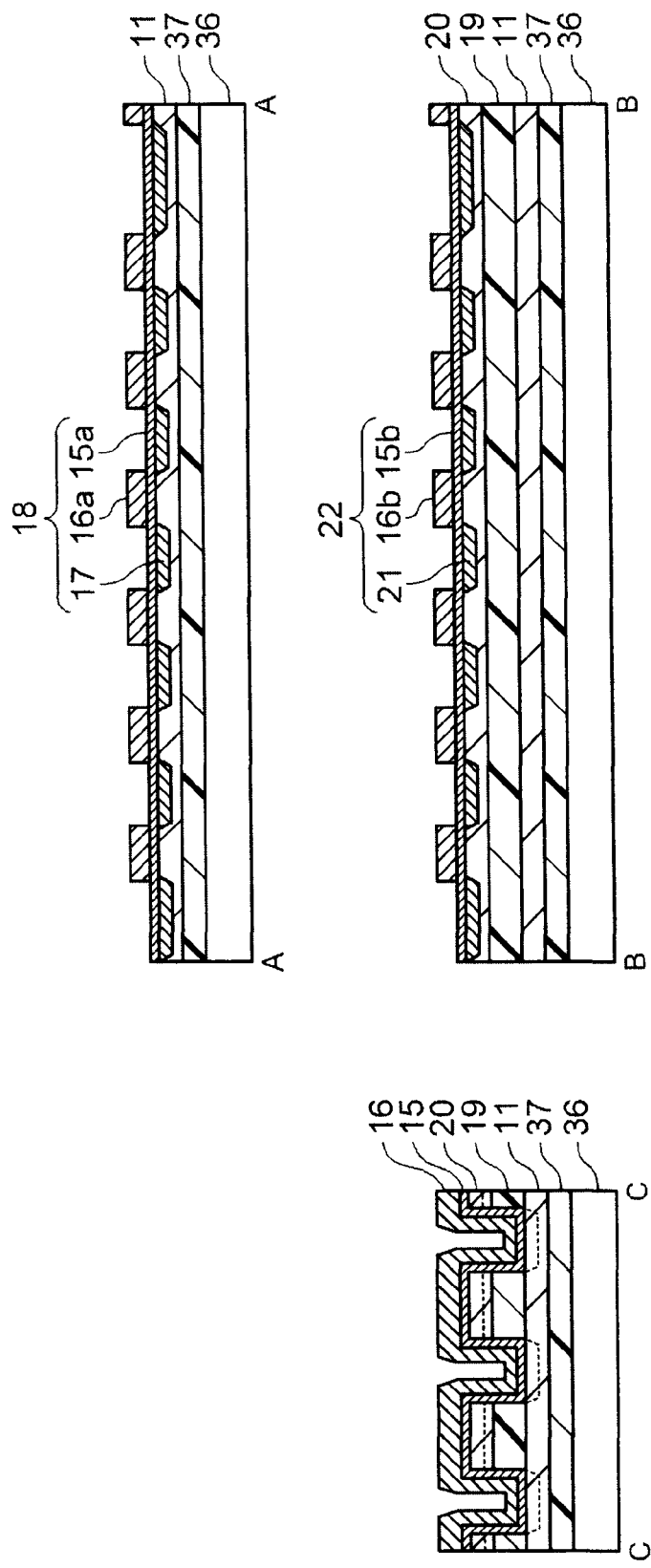

After that, as shown in FIG. 5B, ions of P (phosphorus) are implanted into the first semiconductor layer 11 and the second semiconductor layer 20 through the electric charge accumulating portion 15 in a self-aligned manner by using the control gate electrodes 16 and the selection gate electrodes 23, 25 (not illustrated) as a mask. Subsequently, an activation thermal treatment is applied to the ion-implanted portions, and thereby, the first source/drain impurity diffusion layers 17 and the second source/drain impurity diffusion layers 21 are formed.

Figure 1B:
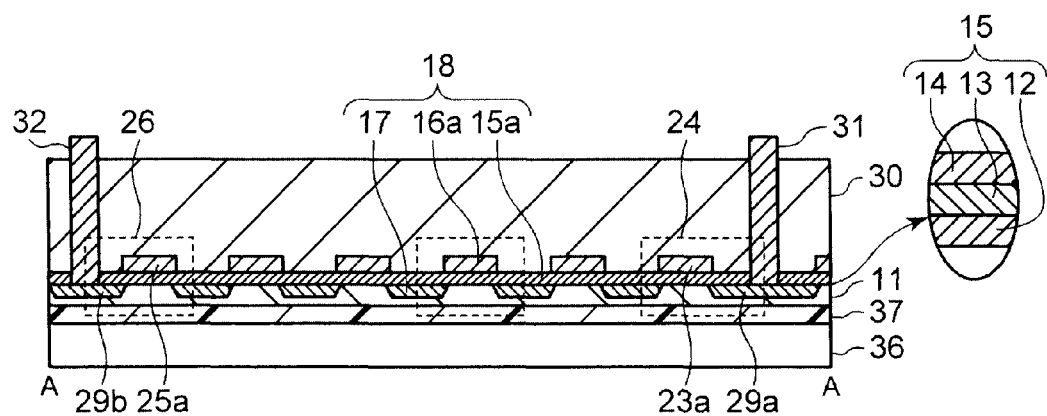
Figure 1C:
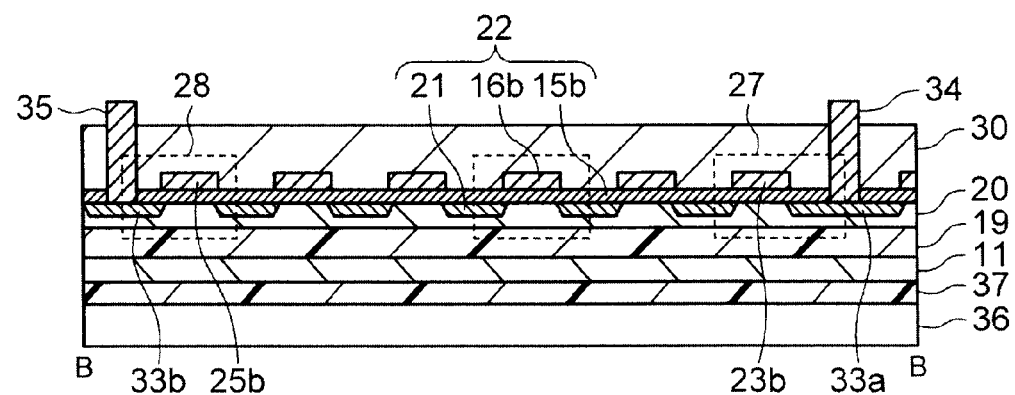
Figure 1D:
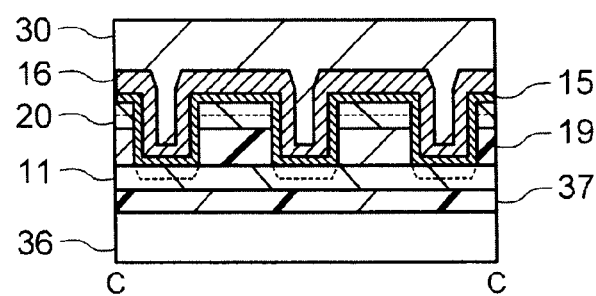

Thereafter, as the interlayer dielectric 30, a tetraethylorthosilicate (TEOS) film is formed, for instance, by CVD. Afterward, contact holes are made in the interlayer dielectric 30. After that, a conductor material is filled into each contact hole. Thereby, the source contacts 31, 34 and the drain contacts 32, 35 are formed. With this, the nonvolatile semiconductor memory 10 as shown in FIG. 1A to 1B is obtained.

Although descriptions have been omitted for the first selection transistors 24, 26 and the second selection transistors 27, 28, brief descriptions will be provided as follows.

In the step shown in FIG. 3C, stripe-shaped openings, which correspond to areas in which the source impurity diffusion layers 29a, 33a and the drain impurity diffusion layers 29b, 33b are formed, are additionally formed in the mask material 51.

Before the step shown in FIG. 5B, the electric charge accumulating portions 15 are removed, which are respectively situated on the areas in which the source impurity diffusion layers 29a, 33a and the drain impurity diffusion layers 29b, 33b are formed. Subsequently, a gate insulating film is formed in a location of each removed electric charge accumulating portion 15. This gate insulating film is formed on each remaining electric charge accumulating portion 15 as well. For this reason, this gate insulating film may be used as a substitute for the oxide film 14 without forming the oxide film 14 in each electric charge accumulating portion 15.

In the step shown in FIG. 5B, in a case where the threshold value of the first and second memory cell transistors 18, 22 is made different from the threshold value of the first selection transistors 24, 26 and the second selection transistors 27, 28, the ion-implantation for forming the first and second memory cell transistors 18, 22 and the ion-implantation are carried out separately by use of the different resist masks.

As described above, the nonvolatile semiconductor memory 10 according to the present embodiment includes the first memory cell transistors 18 and the second memory cell transistors 22 which are arranged so as to be located on different planes, respectively, be isolated as the elements by the insulating film 19 in the direction perpendicular to the main surface of the silicon substrate 36, and have their flat shapes adjacent one to another in the direction in parallel to the main surface of the silicon substrate 36.

As a consequence, it is possible to arrange the first memory cell transistors 18 and the second memory cell transistors 22 densely in the direction in parallel to the main surface of the silicon substrate 36. This makes it possible to obtain the nonvolatile semiconductor memory which includes the memory cell transistors having the structure suitable for increasing the storage capacity.

The foregoing descriptions have been provided for the nonvolatile semiconductor memory in which the film, that is the closest to the control gate electrode out of the films included in each of the first and second electric charge accumulating portions 15a, 15b, is the oxide film 14. However, the closest film may instead be a laminated film including a silicon oxide film and a silicon nitride film. Examples of the laminated film include: a laminated film obtained by laminating a silicon oxide film and a silicon nitride film; and a laminated film (ONO film) obtained by laminating a silicon oxide film, a silicon nitride film and a silicon oxide film.

Embodiment 2

Figure 6:
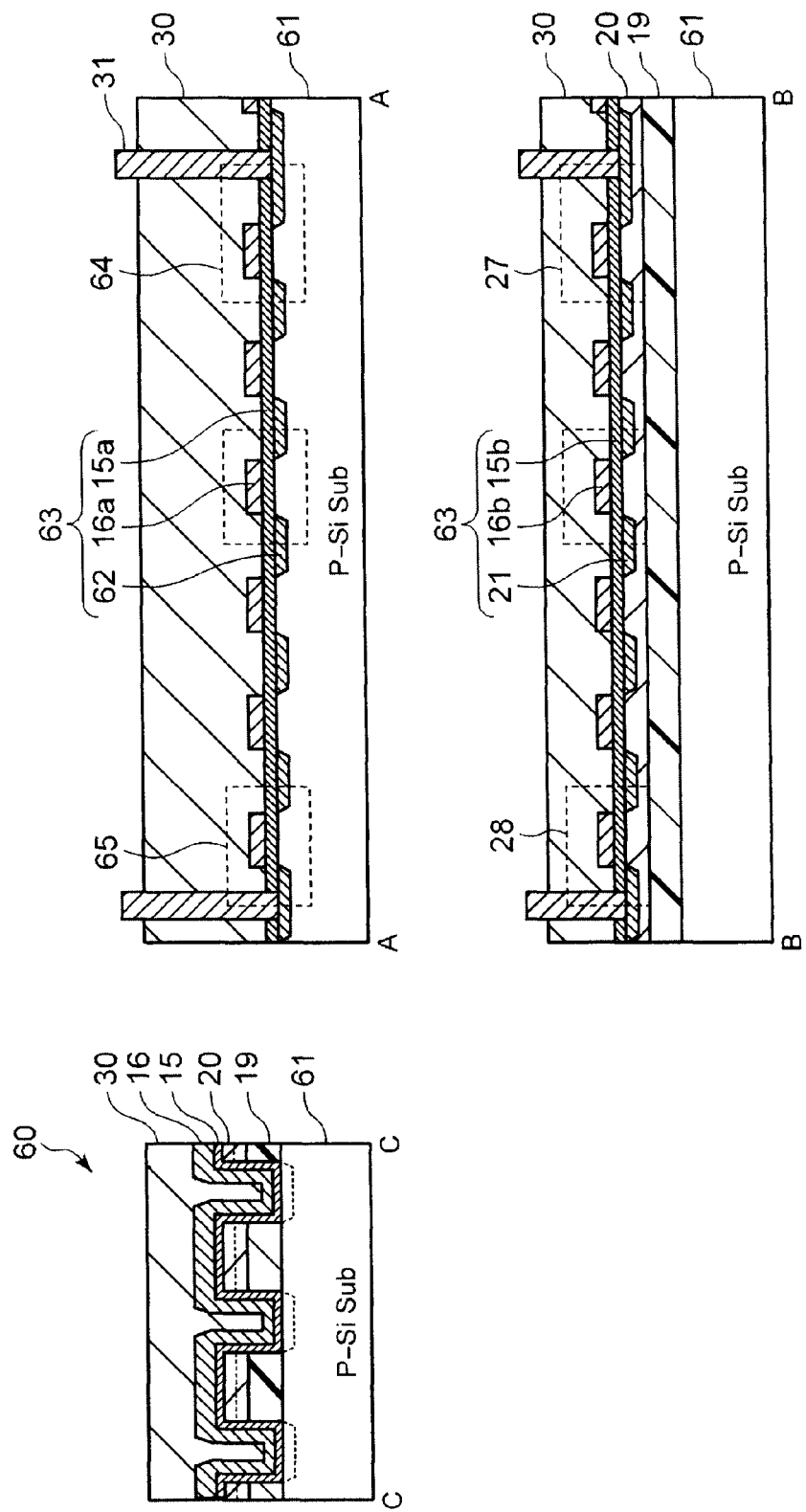
FIG. 6 is a diagram showing a nonvolatile semiconductor memory according to Embodiment 2 of the present invention.

Descriptions will be provided for a nonvolatile semiconductor according to Embodiment 2 of the present invention by use of FIG. 6. FIG. 6 is a cross-sectional view showing the nonvolatile semiconductor memory according to this embodiment.

For this embodiment, component portions identical to those of Embodiment 1 above are denoted by the same reference signs. For this reason, descriptions for the identical component portions will be omitted, and descriptions will be provided for the difference from Embodiment 1. The difference from Embodiment 1 is that the first semiconductor layer is formed as a single-crystal layer.

As shown in FIG. 6, the nonvolatile semiconductor memory 60 includes first memory cell transistors 63. Each first memory cell transistor 63 includes the first control gate electrodes 16a and first source/drain impurity diffusion layers 62. The first control gate electrode 16a is formed on a main surface of a P-type silicon substrate 61 with the first electric charge accumulating portion 15a being interposed in between. The first source/drain impurity diffusion layers 62 are formed with the first control gate electrode 16a being interposed in between. The insulating film 19 is formed on the main surface of the P-type silicon substrate 61.

Each first memory cell transistor 63 is a NMOS transistor having a MONOS structure which is formed on a single-crystal silicon layer. A single-crystal silicon layer is better in crystalline properties (mobility, crystal defects, and the like) than a polycrystalline silicon layer. An MOS transistor formed on the single-crystal silicon layer exhibits a higher performance than an MOS transistor formed on the polycrystalline silicon layer exhibits.

With this taken into consideration, it is desirable that the amount of impurity implanted into each source/drain impurity diffusion layer, and the channel width and length should be controlled in order that the performance of the first memory cell transistors 63 and the performance of the second memory cell transistors 22 coincide with each other in terms of the threshold value, mutual conductance, the like.

This is also the case with first selection transistors 64, 65 formed in the P-type silicon substrate 61 and the second selection transistors 27, 28 formed in the second semiconductor layer 20. For this reason, descriptions thereof will be omitted.

In the nonvolatile semiconductor memory 60 according to this embodiment, as described above, the first memory cell transistors 63 are formed in the P-type silicon substrate 61. This brings about an advantage that the steps of forming the insulating film 37 and the first semiconductor layer 11 can be eliminated.

Embodiment 3

Figure 7A:
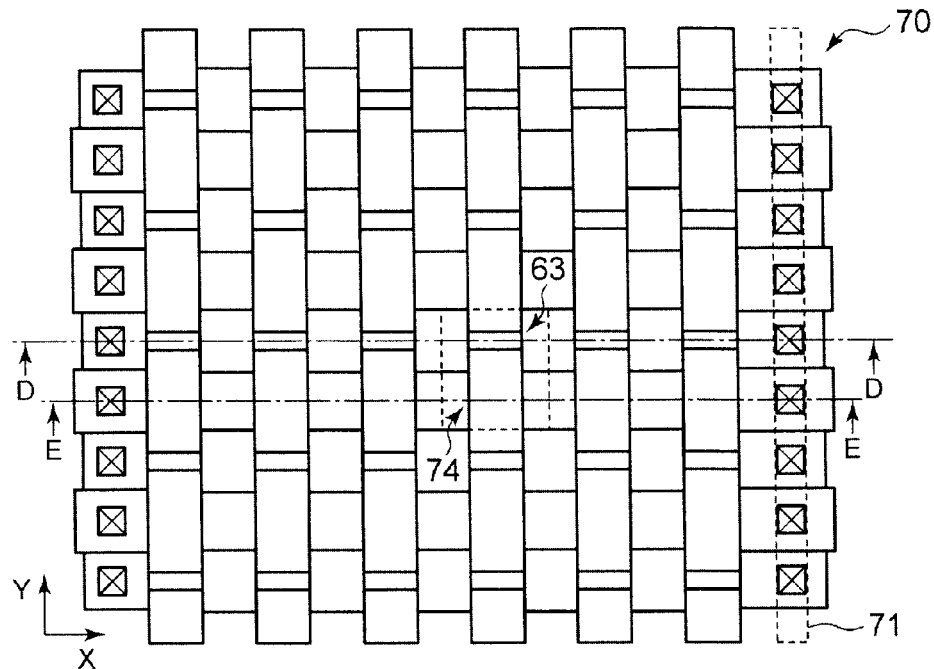
FIGS. 7A to 7C are diagrams showing a nonvolatile semiconductor memory according to Embodiment 3 of the present invention.

Descriptions will be provided for a nonvolatile semiconductor memory according to Embodiment 3 of the present invention by use of FIGS. 7A to 8D. FIGS. 7A to 7C are diagrams showing the nonvolatile semiconductor memory according to this embodiment. FIG. 7A is a plan view of the nonvolatile semiconductor memory. FIG. 7B is a cross-sectional view taken along the D-D line of FIG. 7A, which is viewed in a direction indicated by arrows D. FIG. 7C is a cross-sectional view taken along the E-E line of FIG. 7A, which is viewed in a direction indicated by arrows E. FIGS. 8A to D are cross-sectional view showing main steps in manufacturing the nonvolatile semiconductor memory in the manufacturing sequence.

For this embodiment, component portions identical to those of Embodiment 2 above are denoted by the same reference signs, and descriptions for the identical component portions will be omitted, and descriptions will be provided for the difference from Embodiment 2. The difference from Embodiment 2 is that the second semiconductor layer is formed as a single-crystal layer.

Figure 7B:
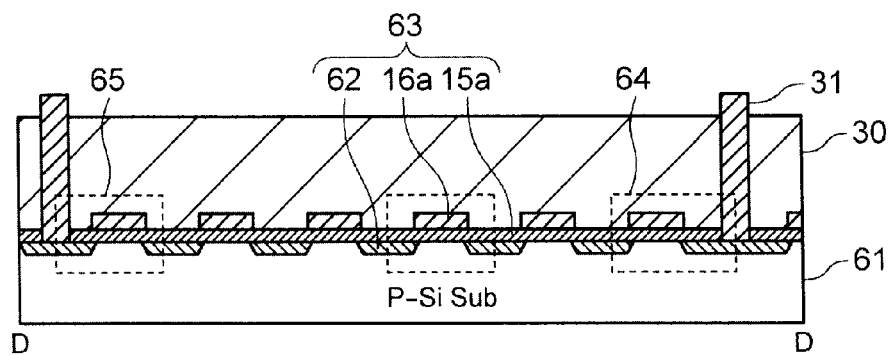
Figure 7C:
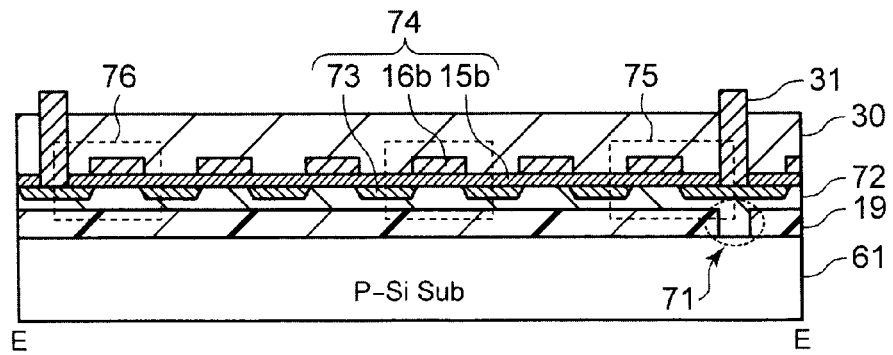

As shown in FIGS. 7A to 7C, the nonvolatile semiconductor memory 70 according to this embodiment includes a second semiconductor layer 72 made of single-crystal silicon and second memory cell transistors 74. The second semiconductor layer 72 is continued to the P-type silicon substrate 61 through a stripe-shaped opening 71 which is made in the insulating film 19 formed on the main surface of the P-type silicon substrate 61. The opening 71 includes areas in which source contacts 31, 34 are respectively formed. Each of the second memory cell transistors 74 includes the second control gate electrode 16b and the second source/drain impurity diffusion layers 73. The second control gate electrode 16b is formed on the second semiconductor layer 72 with the second electric charge accumulating portion 15b being interposed in between. The second source/drain impurity diffusion layers 73 are formed with the second control gate electrode 16b being interposed in between.

Like the first memory cell transistors 63, the second memory cell transistors 74 are NMOS transistors each having the MONOS structure which is formed in the single-crystal silicon layer. For this reason, it is possible to easily make the second memory cell transistors 74 exhibit properties which coincide with that of the first memory cell transistors 63.

This is also the case with first selection transistors 75, 76 formed in the second semiconductor layer 72 made of single-crystal silicon and the first selection transistors 64, 65.

Next, descriptions will be provided for a method of manufacturing the nonvolatile semiconductor memory 70. FIGS. 8A to 8D are cross-sectional views showing main steps in manufacturing the nonvolatile semiconductor memory 70 in the manufacturing sequence.

First of all, as shown in FIG. 8A, as the insulating film 19, a silicon oxide film with a thickness of approximately 500 nm is formed on the main surface of the P-type silicon substrate 61, for instance, by thermal oxidation as in the case of the step shown in FIG. 3A.

Subsequently, as shown in FIG. 8B, a resist film (not illustrated), which has an opening including the areas in which the respective source contacts 31, 34 are formed, is formed on the insulating film 19 by photolithography. Thereafter, the insulating film 19 is etched by RIE using the resist film as a mask. Thereby, the stripe-shaped opening 71, which includes the areas in which the respective source contacts 31, 34 are formed, is formed.

Afterward, as shown in FIG. 8C, the resist film is removed. Subsequently, a P-type polysilicon film 81 with a thickness of approximately 500 nm and with B (boron) added thereto is formed on the insulating film 19, for instance, by CVD so as to fill into the opening 71 and to be in contact with the P-type silicon substrate 61.

After that, as shown in FIG. 8D, a laser beam is emitted onto the polysilicon film 81. Thereby, the polysilicon film 81 is single-crystallized by solid-phase epitaxy using the P-type silicon substrate 61 as a template for crystal growth. Thereby, the second semiconductor layer 72 is formed.

Afterward, the nonvolatile semiconductor memory 70 as shows in FIGS. 7A to 7C is obtained through the steps which are the same as the steps shown in FIGS. 3C to 5B.

As described above, the nonvolatile semiconductor memory 70 includes: the first memory cell transistors 63 formed in the silicon substrate 61; and the second memory cell transistors 74 formed in the second semiconductor layer 72 which is single-crystallized by solid-phase epitaxy. As a consequence, the first memory cell transistors 63 and the second memory cell transistors 74 are formed as single-crystal silicon layers. This brings about an advantage that the first memory cell transistors 63 and the second memory cell transistors 74 which have a higher performance, and whose characteristics coincide with each other can be obtained.

The foregoing descriptions have been provided for a case where the stripe-shaped opening 71 formed so as to include the areas in which the respective source contacts 31, 34 are formed. However, the stripe-shaped opening 71 does not have to include the areas in which the respective source contacts 31, 34 are formed, as long as the stripe-shaped opening 71 is formed in the source region.

In addition, the stripe-shaped opening 71 may be formed in a region other than the source region. Nevertheless, it is desirable that the stripe-shaped opening 71 should be formed in the source region, because the formation in the source region saves the occupied area of the stripe-shaped opening 71.

The foregoing descriptions have been provided for the case where the polysilicon film 81 is single-crystallized by solid-phase epitaxy from the source contact side. Nevertheless, the polysilicon film 81 may be single-crystallized from the drain side, or from the source and drain sides.

Figure 9A:
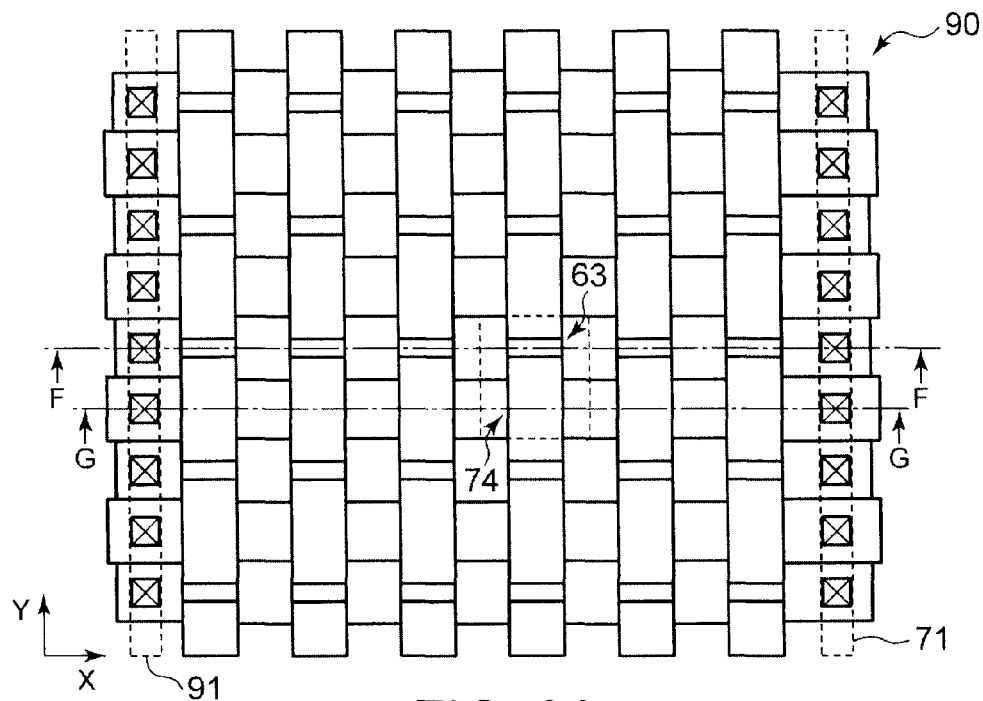
FIGS. 9A to 9C are diagrams showing another nonvolatile semiconductor memory according to Embodiment 3 of the present invention.
Figure 9B:
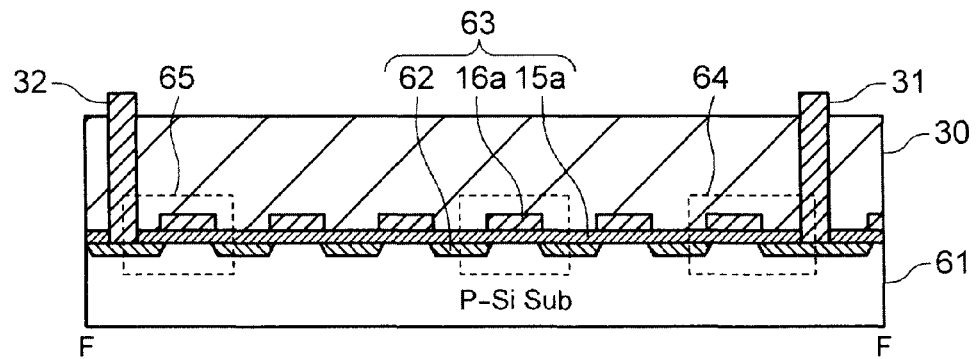
Figure 9C:
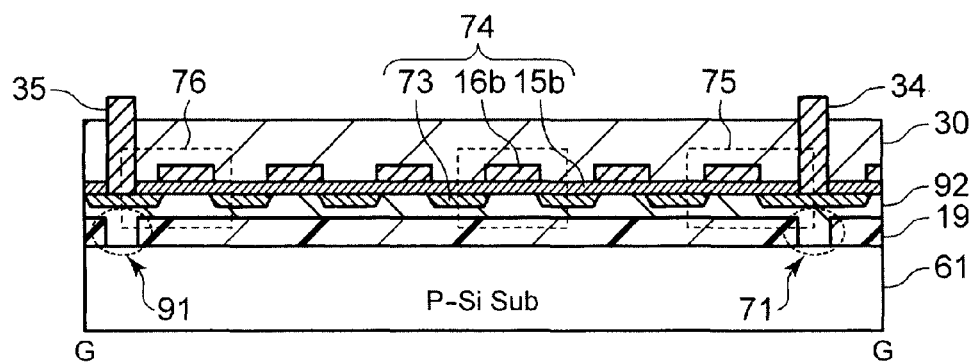

FIGS. 9A to 9C are diagrams showing a nonvolatile semiconductor memory in which the polysilicon film is single-crystallized by solid-phase epitaxy from both the source and drain sides. FIG. 9A is a plan view of the non volatile semiconductor memory. FIG. 9B is a cross-sectional view taken along the F-F line of FIG. 9B, which is viewed in a direction indicated by arrows F. FIG. 9C is a cross-sectional view taken along the G-G line of FIG. 9A, which is viewed in a direction indicated by arrows G.

As shown in FIGS. 9A to 9C, the nonvolatile semiconductor memory 90 includes a second semiconductor layer 92 made of single-crystal silicon, which is continued to the P-type silicon substrate 61 through the stripe-shaped opening 71 and a stripe-shaped opening 91 which are made in the insulating film 19 formed on the main surface of the P-type silicon substrate 61. The opening 71 includes the areas in which the source contacts 31, 34 are respectively formed. The opening 91 includes areas where drain contacts 32, 35 are respectively formed.

Because the polysilicon film 81 is single-crystallized from both the source and drain sides, the nonvolatile semiconductor memory 90 is advantageous in that time needed for single-crystallization can be shortened.

Furthermore, in a case where the number of memory cell transistors connected to each NAND string is increased for densely mounting more memory cell transistors in the nonvolatile semiconductor memory, the additional connection of the second semiconductor layer 92 to the silicon substrate 61 on the drain side makes it possible to apply voltages to the second semiconductor layer 92 securely. This brings about an advantage that the nonvolatile semiconductor memory is capable of performing its operations stably.

Embodiment 4

Descriptions will be provided for a nonvolatile semiconductor memory according to Embodiment 4 of the present invention by use of FIGS. 10A to 10O. FIGS. 10A to 10O are diagrams showing the nonvolatile semiconductor memory according to this embodiment. FIG. 10A is a plan view of the nonvolatile semiconductor memory. FIG. 10B is a cross-sectional view taken along the H-H line of FIG. 10A, which is viewed in a direction indicated by arrows H. FIG. 10O is another cross-sectional view taken along the I-1 line of FIG. 10A, which is viewed in a direction indicated by arrows I.

For this embodiment, component portions identical to those of Embodiment 1 above are denoted by the same reference signs, and descriptions for the identical component portions will be omitted, and descriptions will be provided for the difference from Embodiment 1. The difference from Embodiment 1 is that the first and second semiconductor layers are connected to their source contacts.

To put it concretely, as shown in FIG. 10A, the nonvolatile semiconductor memory 100 according to this embodiment includes P-type diffusion layers 101, polysilicon or tungsten electrodes 102 and source contacts 103. The P-type diffusion layers 101 respectively penetrate the source impurity diffusion layers 29a of the source-side first selection transistors 24. Thus, the P-type diffusion layers 101 are in contact with the first semiconductor layer 11. The polysilicon or tungsten electrodes 102 is provided upright on the respective P-type diffusion layers 101, and extend to the middle of the interlayer dielectric 30. The lowermost end surfaces of the source contacts 103 are in contact with the source impurity diffusion layers 29a and the P-type diffusion layers 101. The source contacts 103 cover the respective polysilicon or tungsten electrodes 102.

The nonvolatile semiconductor memory 100 further includes P-type diffusion layers 101, polysilicon or tungsten electrodes 102 and source contacts 104. The P-type diffusion layers 101 respectively penetrate the source impurity diffusion layers 33a of the respective source-side second selection transistors 27. Thus, the P-type diffusion layers 101 are in contact with the second semiconductor layers 20. The polysilicon or tungsten electrodes 102 are provided upright on the respective P-type diffusion layers 101, and extend to the middle of the interlayer dielectric 30. The lowermost end surfaces of the source contacts 104 are in contact with the source impurity diffusion layers 33a and the P-type diffusion layers 101, respectively. The source contacts 104 cover the respective polysilicon or tungsten electrodes 102.

The polysilicon or tungsten electrodes 102 are provided for securing the contact between the P-type diffusion layers 101 and the source contacts 103, as well as the contact between the other P-type diffusion layers 101 and the source contacts 104, respectively.

The first conductor layers 11 and the source impurity diffusion layers 29a of the first selection transistors 24 are commonly connected to the source contacts 103, respectively. Similarly, the second conductor layers 20 and the source impurity diffusion layers 33a of the second selection transistors 27 are commonly connected to the source contacts 104, respectively. These common connections make it possible to apply the voltages to each first semiconductor layer 11 and each second semiconductor layer 20 directly. For this reason, the nonvolatile semiconductor memory 100 is capable of performing its erasing operation stably.

Next, descriptions will be provided for main steps in manufacturing the nonvolatile semiconductor memory 100. Before the step shown in FIG. 5B, a mask material corresponding to the P-type diffusion layers 101 are formed on the areas in which the source contacts 103, 104 are formed. Thereby, during the step shown in FIG. 5B, the P-type diffusion layers 101 are formed at the same time as the first and second source/drain impurity diffusion layers 17, 21 are formed by implanting P ions into the first and second semiconductor layers 11, 20.

In other words, areas, in which no P ions are implanted in the first and second semiconductor layers 11, because of the masking of the areas with the mask material, are left as the P-type diffusion layers 101.

Subsequently, the interlayer dielectric 30 is formed. Thereafter, a slit is formed in a region, which corresponds to the P-type diffusion layers 101, in the interlayer dielectric 30. Thereafter, a P-type polysilicon film with a low resistance is filled into the slit by CVD until the top of the P-type polysilicon film comes up to the middle of the interlayer dielectric 30. Thereby, the polysilicon or tungsten electrode 102 is formed.

Afterward, contact holes are made in the interlayer dielectric 30, and then a conductor material, for instance, aluminum (Al), tungsten (W), tungsten silicide (WSi) or the like is filled into each contact hole. Thereby, the source contacts 103, 104 are formed at the same time as the drain contacts 32, 35 are formed.

As described above, the nonvolatile semiconductor memory 100 according to this embodiment includes: the P-type diffusion layers 101 penetrating the respective source impurity diffusion layers 29a, and thus reaching the P-type semiconductor layer 11; the P-type diffusion layers 101 penetrating the respective source impurity diffusion layers 33a, and thus reaching the P-type semiconductor layer 20; the polysilicon or tungsten electrodes 102 provided upright on the respective P-type diffusion layers 101, and extending to the middle of the interlayer dielectric 30; and the source contacts 103, 104, the lowermost end surfaces of the source contacts 103 respectively being in contact with the source impurity diffusion layers 29a and the P-type diffusion layers 101, the lowermost end surfaces of the source contacts 104 respectively being in contact with the source impurity diffusion layers 33a and the P-type diffusion layers 101, the source contacts 103, 104 covering the respective polysilicon or tungsten electrodes 102.

As a consequence, the first semiconductor layer 11 is connected to the source contacts 103, and the second semiconductor layer 20 is connected to the source contacts 104. This makes it possible to apply the voltages to the first semiconductor layer 11 and the second semiconductor layer 20 directly. This brings about an advantage that a stable operation can be obtained.

Embodiment 5

Figure 11B:
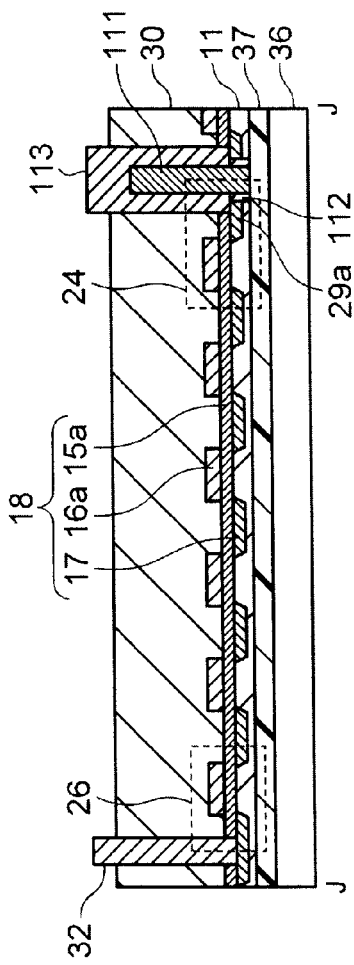
FIGS. 11A to 11C are diagrams showing a nonvolatile semiconductor memory according to Embodiment 5 of the present invention.
Figure 11C:
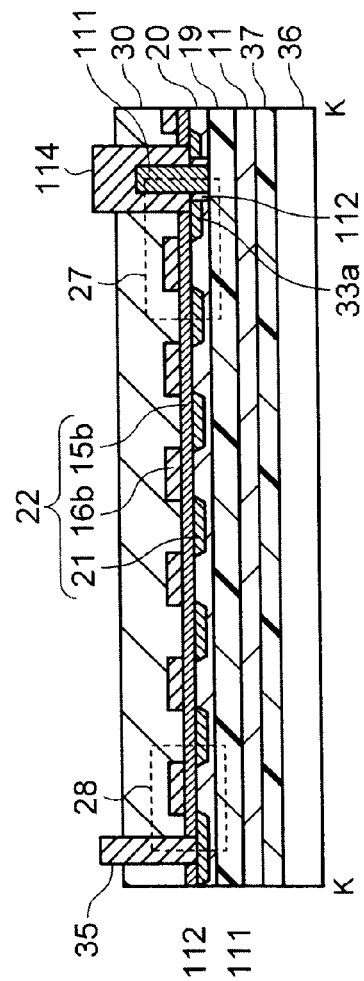
Figure 11A:
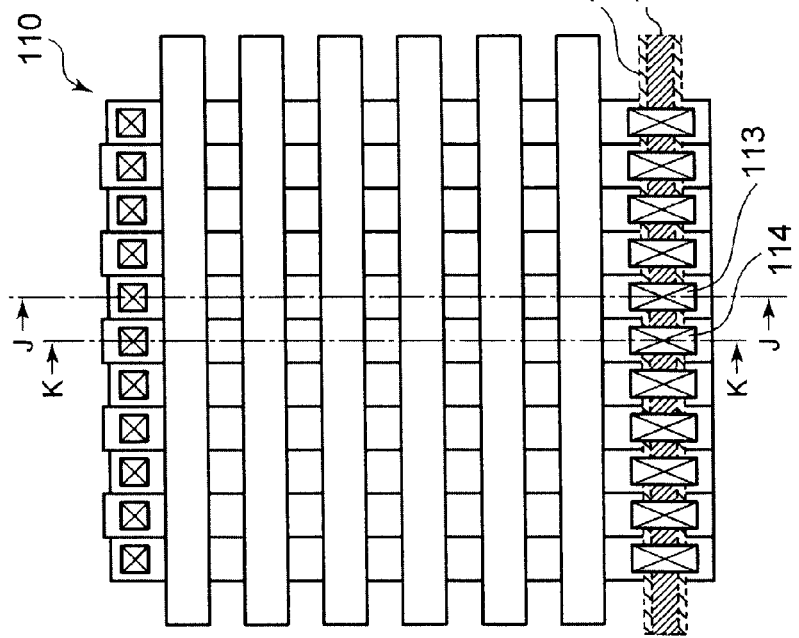

Descriptions will be provided for a nonvolatile semiconductor memory according to Embodiment 5 of the present invention by use of FIGS. 11A to 11C. FIGS. 11A to 11C are diagrams showing the nonvolatile semiconductor memory according to this embodiment. FIG. 11A is a plan view of the nonvolatile semiconductor memory. FIG. 11B is a cross-sectional view taken along the J-J line of FIG. 11A, which is viewed in a direction indicated by arrows J. FIG. 11C is another cross-sectional view taken along the K-K line of FIG. 11A, which is viewed in a direction indicated by arrows K.

For this embodiment, component portions identical to those of Embodiment 4 above are denoted by the same reference signs. For this reason, descriptions for the identical component portions will be omitted, and descriptions will be provided for the difference from Embodiment 4. The difference from Embodiment 4 is that the side surfaces of each of the first semiconductor layer and the second semiconductor layer are in contact with the side surfaces of each polysilicon or tungsten electrode with P-type diffusion layers being interposed in between.

To put it specifically, as shown in FIGS. 11A to 11C, the nonvolatile semiconductor memory 110 according to the present embodiment includes polysilicon or tungsten electrodes 111, P-type diffusion layers 112 and source contacts 113. Each polysilicon or tungsten electrode 111 is provided upright on the insulating film 37, and penetrates the first semiconductor layer 11 and the source impurity diffusion layer 29a of the corresponding source-side first selection transistor 24, accordingly extending to the middle of the interlayer dielectric 30. One P-type diffusion layer 112 is formed between one side surface of the polysilicon or tungsten electrode 111 and one side surfaces of the first semiconductor layer 11 and the corresponding source impurity diffusion layer 29a. Another P-type diffusion layer 112 is formed between the other side surface of the polysilicon or tungsten electrode 111 and the other side surfaces of the first semiconductor layer 11 and the corresponding source impurity diffusion layer 29a. The lowermost end surfaces of the source contacts 113 are in contact with the respective source impurity diffusion layers 29a. Thus, the source contacts 113 cover the respective polysilicon or tungsten electrodes 111.

Similarly, the nonvolatile semiconductor memory 110 according to the present embodiment includes polysilicon or tungsten electrodes 111, P-type diffusion layers 112 and source contacts 114. Each polysilicon or tungsten electrode 111 is provided upright on the insulating film 19, and penetrates the second semiconductor layer 20 and the source impurity diffusion layer 33a of the corresponding source-side first selection transistor 27, accordingly extending to the middle of the interlayer dielectric 30. One P-type diffusion layer 112 is formed between one side surface of the polysilicon or tungsten electrode 111 and one side surfaces of the second semiconductor layer 20 and the corresponding source impurity diffusion layer 33a. Another P-type diffusion layer 112 is formed between the other side surface of the polysilicon or tungsten electrode 111 and the other side surfaces of the second semiconductor layer 20 and the corresponding source impurity diffusion layer 33a. The lowermost end surfaces of the source contacts 114 are in contact with the respective source impurity diffusion layers 33a. Thus, the source contacts 113 cover the respective polysilicon or tungsten electrodes 111.

The P-type diffusion layers 112 are provided for: securing the contacts between the polysilicon or tungsten electrodes 111 and the first semiconductor layer 11, as well as the contacts between the other polysilicon or tungsten electrodes 111 and the second semiconductor layer 20; and thereby reducing the contact resistances. The P-type diffusion layers 112 are formed in the following manner. Contact holes are formed in each of the first semiconductor layer 11 and the second conductor layer 20, and thereafter ions of a P-type impurity such as boron are implanted in side walls of each contact hole.

In the nonvolatile semiconductor memory 110 according to the present embodiment, as described above, the side surfaces of the first semiconductor layer 11 are in contact with the side surfaces of each polysilicon or tungsten electrode 111 with the corresponding P-type diffusion layers being interposed in between, respectively. Furthermore, the side surfaces of the second semiconductor layer 20 are in contact with the side surfaces of each polysilicon or tungsten electrode 111 with the corresponding P-type diffusion layers being interposed in between, respectively.

The present embodiment is a structure suitable for the case where the contact areas between the side surfaces of each polysilicon or tungsten electrode 111 and the side surfaces of each of the first and second semiconductor layers 11, 20 are larger than the contact area between the top surface of each P-type diffusion layer 101 and the lowermost end surface of each of the polysilicon or tungsten electrodes 103, 104. In addition, because the side walls are used, the nonvolatile semiconductor memory 110 is advantageous in that the occupied areas thereof can be made smaller.

In Embodiments 4 and 5, it is possible to thin out contacts with the upper layer interconnections because of the simultaneous common connection of the contacts to the source impurity diffusion layers or to the source impurity diffusion layers and the P-type diffusion layers.

Figure 12:
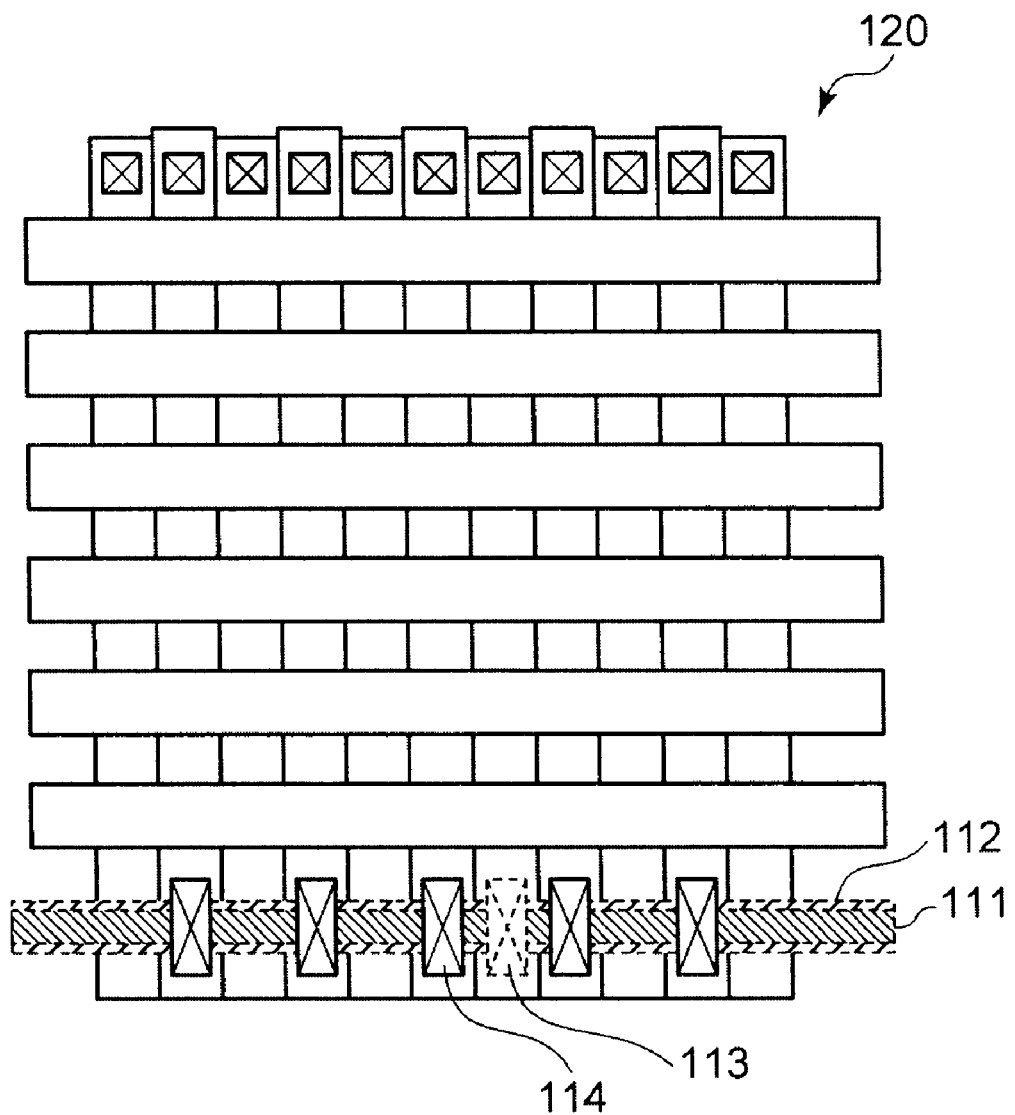
FIG. 12 is a plan view of another nonvolatile semiconductor memory according to Embodiment 5 of the present invention.

FIG. 12 is a plan view of a nonvolatile semiconductor memory in which the source contacts are thinned out. In a nonvolatile semiconductor memory 120, as shown in FIG. 12, thinning out is performed every other source contacts.

No specific restriction is imposed on how the source contacts should be thinned out. Nevertheless, it is desirable that the source contacts 114 should be left by removing the source contacts 113. This is because the source contacts 114 can be more easily processed than the source contacts 113 due to the shallower depth of the contact hole.

Embodiment 6

Descriptions will be provided for a nonvolatile semiconductor memory according to Embodiment 6 of the present invention by use of FIGS. 13A to 13C. FIGS. 13A to 13C are diagrams showing the nonvolatile semiconductor memory according to the present embodiment. FIG. 13A is a plan view of the nonvolatile semiconductor memory. FIG. 13B is a cross-sectional view of the nonvolatile semiconductor memory taken along the L-L line of FIG. 13A, which is viewed in a direction indicated by arrows L. FIG. 13C is another cross-sectional view taken along the M-M line of FIG. 13A, which is viewed in a direction indicated by arrows M.

For this embodiment, component portions identical to those of Embodiment 4 above are denoted by the same reference signs. For this reason, descriptions for the identical component portions will be omitted, and descriptions will be provided for the difference from Embodiment 4. The difference from Embodiment 4 is that the first semiconductor layer is that the first semiconductor and second semiconductor layers are connected to their source contacts with the P-type impurity diffusion layers being interposed in between.

To put it specifically, as shown in FIGS. 13A to 13C, the nonvolatile semiconductor memory 130 includes P-type diffusion layers 131 and source contacts 132. The P-type diffusion layers 131 respectively penetrate the source impurity diffusion layers 29a of the source-side first selection transistors 24, and thus reach the first semiconductor layer 11. The lowermost end surfaces of the source contacts 132 are in contact with the source impurity diffusion layers 29a and the P-type diffusion layers 131, respectively.

The nonvolatile semiconductor memory 130 further includes P-type diffusion layers 131 and source contacts 133. The P-type diffusion layers 131 respectively penetrate the source impurity diffusion layers 33a of the source-side second selection transistors 27, and thus reach the second semiconductor layer 20. The lowermost end surfaces of the source contacts 133 are in contact with the source impurity diffusion layers 33a and the P-type diffusion layers 131, respectively.

The first semiconductor 11 and the source impurity diffusion layers 29a are commonly connected to the source contacts 132. Similarly, the second semiconductor 20 and the source impurity diffusion layers 33a are commonly connected to the source contacts 133.

As described above, the nonvolatile semiconductor memory 130 according to this embodiment is advantageous in that the step of forming the polysilicon or tungsten electrodes 102 as shown in FIGS. 10A to 10O can be eliminated. That is because the first semiconductor layer 11 is connected to the source contacts 132 with the P-type impurity diffusion layers 131 being interposed in between whereas the second semiconductor layer 20 is connected to the source contacts 133 with the P-type impurity diffusion layers 131 being interposed in between.

This embodiment is a structure suitable for a case where the contact resistances between the first semiconductor layer 11 and the source contacts 132 and the contact resistances between the second semiconductor layer 20 and the source contacts 133 are fully low.

Embodiment 7

Figure 14A:
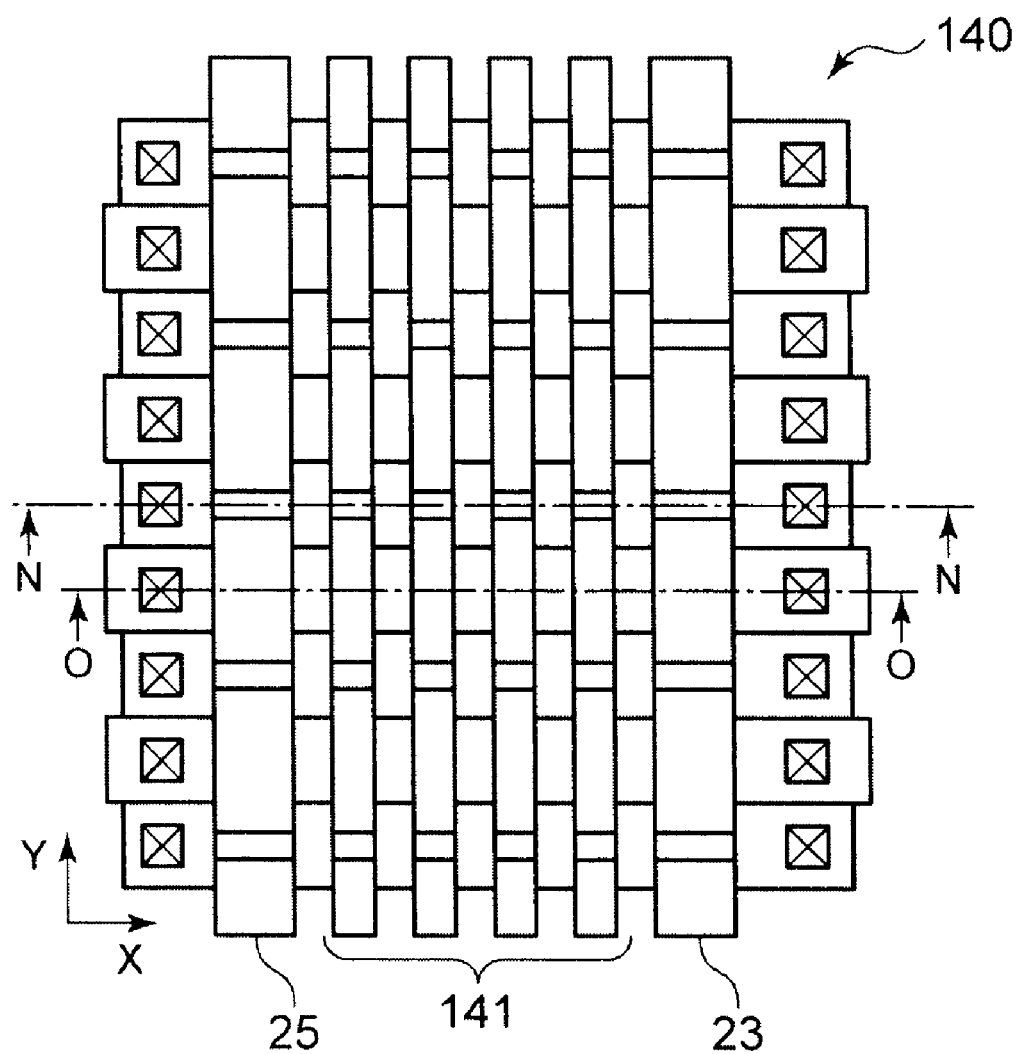
FIGS. 14A to 14C are diagrams showing a nonvolatile semiconductor memory according to Embodiment 7 of the present invention.
Figure 14B:
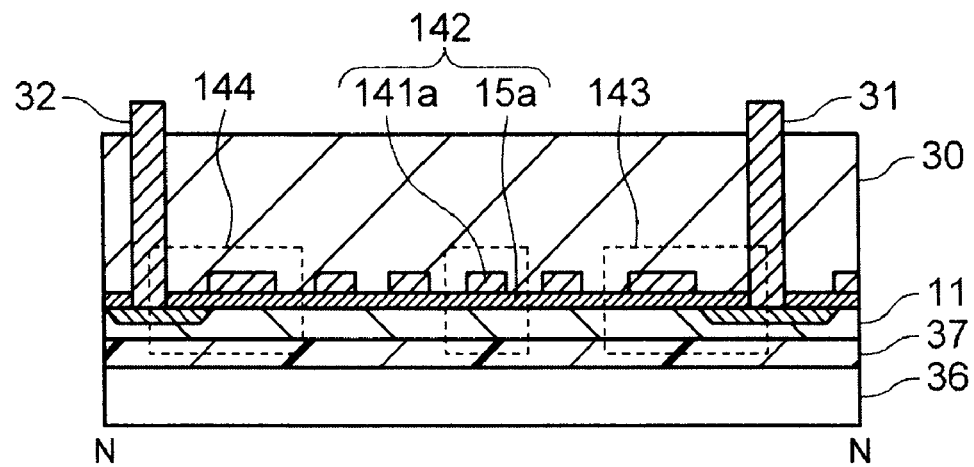
Figure 14C:
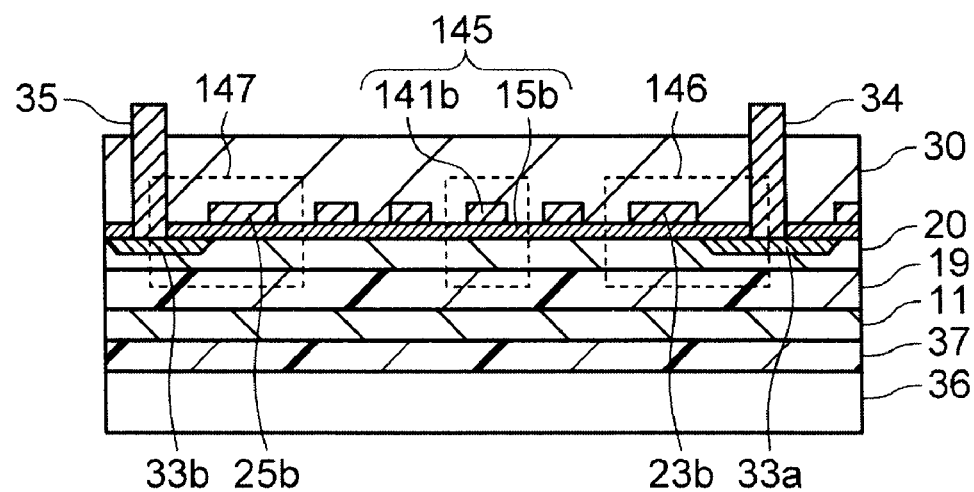

Descriptions will be provided for a nonvolatile semiconductor memory according to Embodiment 7 of the present invention by use of FIGS. 14A to 14C. FIGS. 14A to 14C are diagrams showing the nonvolatile semiconductor memory according to the present embodiment. FIG. 14A is a plan view of the nonvolatile semiconductor memory. FIG. 14B is a cross-sectional view of the nonvolatile semiconductor memory taken along the N-N line of FIG. 14A, which is viewed in a direction indicated by arrows N. FIG. 14C is another cross-sectional view taken along the O-O line of FIG. 14A, which is viewed in a direction indicated by arrows O.

For this embodiment, component portions identical to those of Embodiment 1 above are denoted by the same reference signs. For this reason, descriptions for the identical component portions will be omitted, and descriptions will be provided for the difference from Embodiment 1. The difference from Embodiment 1 is that: the first and second control gate electrodes are miniaturized; and the N-type impurity diffusion layers are eliminated.

To put it concretely, as shown in FIGS. 14A to 14C, a nonvolatile semiconductor memory 140 according to this embodiment includes first NAND strings and second NAND strings. Each first NAND string includes first memory cell transistors 142 connected together in series on the main surface of the P-type first semiconductor layer 11 and paired first selection transistors 143, 144 connected to the two endmost first memory cell transistors 142, respectively. Each first memory cell transistor 142 includes a first control gate electrode 141a which is formed on the main surface of the first semiconductor layer 11 with the electric charge accumulating portion 15a being interposed in between. Each second NAND string includes second memory cell transistors 145 connected together in series on the main surface of the P-type second semiconductor layer 20 and paired second selection transistors 146, 147 connected to the two endmost second memory cell transistors 145, respectively. Each second memory cell transistor 145 includes a second control gate electrode 141b which is formed on the main surface of the second semiconductor layer 20 with the second electric charge accumulating portion 15b being interposed in between. The second semiconductor layer 20 is formed on the first semiconductor layer 11, in an area other than that in which the first memory cell transistors 142 are respectively formed, with the insulating film 19 thicker than the first electric charge accumulating portion 15a being interposed in between.

Commonalty is established between the first control gate electrode 141a and the second control gate electrode 141b; a first selection gate electrode 23a of the first selection transistor 143 and a second selection gate electrode 23b of the second selection transistor 146 are formed of a single body; and a first selection gate electrode 25a of the first selection transistor 144 and a second selection gate electrode 25b of the second selection transistor 147 are formed of a single body.

Suppose a case where the gate lengths of the respective first and second control gate electrodes 141a, 141b are made narrower. When N-type impurity diffusion layers are provided in a way that each first control gate electrode 141a is interposed between two adjacent N-type impurity diffusion layers, and in a way that each second control gate electrode 141b is interposed between two adjacent N-type impurity diffusion layers, as in the case of the conventional nonvolatile semiconductor memory, a punch-through occurs in each first memory cell transistor 142 and each second memory cell transistor 145. As a result, each memory cell transistor 142 and each memory cell transistor 145 are not cut off.

For this reason, if no N-type impurity diffusion layers are provided, it is possible to miniaturize the first and second control gate electrodes 141a, 142b. Whether or not the N-type impurity diffusion layers can be eliminated is determined depending on the space between each two adjacent first control gate electrodes 141a, the space between each two adjacent second control gate electrodes 141b, the impurity concentration and operational voltage of each of the first semiconductor layer 11 and the second semiconductor layer 20.

In other words, each first memory cell transistor 142 is a memory cell transistor which includes a miniaturized first control gate electrode 141a, but which includes no two adjacent N-type source/drain impurity diffusion layers formed with the first control gate electrode 141a being interposed in between. Furthermore, each second memory cell transistor 145 is a memory cell transistor which includes a miniaturized second control gate electrode 141b, but which includes no two adjacent N-type source/drain impurity diffusion layers formed with the second control gate electrode 141b being interposed in between.

The memory cell transistors are operated as follows. In any one first NAND string, the low voltage is applied to the first control gate electrodes 141a of unselected first memory cell transistors 142 in order to transmit a voltage, which is applied to the drains of the first selection transistors 143, 144, to selected first memory cell transistors 142. In addition, the low voltage is applied to the selection gate electrodes 23a, 25a of the first selection transistors 143, 144 as well. When data is written to the selected first memory cell transistors 142, the high voltage is applied to the first control gate electrodes 141a of the selected first memory cell transistors 142. When data is read from the selected first memory cell transistor 142, a desired voltage is applied to the first control gate electrodes 141a of the selected first memory cell transistors 142 in order to detect whether the first memory cell transistors 142 are on or off. This operational scheme is also the case with any one second NAND string.

Data is capable of being erased at a time by: applying the high voltage to the drain and source of each selection transistor, the first semiconductor layer 11 as well as the second semiconductor layer 20; applying a floating voltage or the high voltage to the first selection transistors 143, 144 and the second selection transistors 146, 147; and applying the ground voltage to the control gate electrodes 141.

As described above, the nonvolatile semiconductor memory 140 according to the present embodiment includes the first and second memory cell transistors 142, 145. In this respect, each first memory cell transistor 142 includes the miniaturized first control gate electrode 141a; each second memory cell transistor 145 includes the miniaturized second control gate electrode 141b; and none of the first and second memory cell transistors 142, 145 include N-type impurity diffusion layers.

As a consequence, this brings about an effect that the nonvolatile semiconductor memory 140 can be further smaller in size than the nonvolatile semiconductor memory 10 according to Embodiment 1.

Having described the embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A nonvolatile semiconductor memory comprising:
   a first memory cell transistor including a first control gate electrode and first source/drain impurity diffusion layers, the first control gate electrode being formed on a main surface of a first semiconductor layer of a first conductivity type with a first electric charge accumulating portion being interposed in between, the first source/drain impurity diffusion layers being of a second conductivity type and being formed to sandwich the first control gate electrode in between; and
   a second memory cell transistor including a second control gate electrode and second source/drain impurity diffusion layers, the second control gate electrode being formed on a main surface of a second semiconductor layer of the first conductivity type, the second source/drain impurity diffusion layers being of the second conductivity type and being formed to sandwich the second control gate electrode in between, the second semiconductor layer being formed on the first semiconductor layer with an insulating film being interposed in between in an area other than that in which the first memory cell transistor is formed, the insulating film being thicker than the first electric charge accumulating portion.

2. The nonvolatile semiconductor memory according to claim 1, wherein
   an end portion of the first memory cell transistor in a channel width direction and an end portion of the second memory cell transistor in the channel width direction are situated in a plane perpendicular to the main surface of the first semiconductor layer.

3. The nonvolatile semiconductor memory according to claim 1, wherein
   a combination of the first semiconductor layer and the second semiconductor layer is any one of a combination in which both of the first and second semiconductor layers are polycrystalline layers, a combination in which both of the first and second semiconductor layers are single-crystalline layers, and a combination in which the first and second semiconductor layers are a single-crystalline layer and a polycrystalline layer, respectively.

4. The nonvolatile semiconductor memory according to claim 1, comprising:
   a first NAND string including a plurality of the first memory cell transistors and paired first selection transistors connected respectively to endmost ones of the first memory cell transistors, the first memory cell transistors being connected together in series in such a way that each two adjacent ones of the first memory cell transistors share the first source/drain impurity diffusion layer existing in between; and
   a second NAND string including a plurality of the second memory cell transistors and paired second selection transistors connected respectively to endmost ones of the second memory cell transistors, the second memory cell transistors being connected together in series in such a way that each two adjacent ones of the second memory cell transistors share the second source/drain impurity diffusion layer existing in between, wherein
   the first control gate electrode and the second control gate electrode are formed of a single body, and a first selection gate electrode of the first selection transistor and a second selection gate electrode of the second selection transistor are formed of a single body.

5. The nonvolatile semiconductor memory according to claim 4, wherein
   the first semiconductor layer is formed on a main surface of a semiconductor substrate with an insulating film being interposed in between and is connected to a first source contact via a first conduction portion whose one side portion penetrates
   a source impurity diffusion layer of a source-side one of the first selection transistors and is in contact with the first semiconductor layer, and whose different side portion is in contact with the first source contact configured to connect the source impurity diffusion layer to an outside, and
   the second semiconductor layer is connected to a second source contact via a second conduction portion whose one side portion penetrates a source impurity diffusion layer of a source-side one of the second selection transistors and is in contact with the second semiconductor layer, and whose different side portion is in contact with the second source contact configured to connect the source impurity diffusion layer to the outside.

6. The nonvolatile semiconductor memory according to claim 5, wherein
   the first conduction portion includes a P-type diffusion layer and a polysilicon or tungsten electrode, the P-type diffusion layer penetrating the first source impurity diffusion layer and being thus in contact with the first semiconductor layer, the polysilicon or tungsten electrode provided upright on the P-type diffusion layer, side surfaces of the polysilicon or tungsten electrode being respectively in contact with the inner surfaces of the first source contact, and
   the second conduction portion includes the P-type diffusion layer and the polysilicon or tungsten electrode, the P-type diffusion layer penetrating the second source impurity diffusion layer and being thus in contact with the second semiconductor layer, the polysilicon or tungsten electrode provided upright on the P-type diffusion layer, side surfaces of the polysilicon or tungsten electrode being respectively in contact with the inner surfaces of the second source contact.

7. The nonvolatile semiconductor memory according to claim 5, wherein
   the first conduction portion includes a polysilicon or tungsten electrode whose one side surface is in contact with a side surface of the first semiconductor layer with a P-type diffusion layer being interposed in between and whose different side surface is in contact with an inner surface of the first source contact, and the second conduction portion is a polysilicon or tungsten electrode whose one side surface is in contact with a side surface of the second semiconductor layer with the P-type diffusion layer being interposed in between, and whose different side surface is in contact with an inner surface of the second source contact.

8. The nonvolatile semiconductor memory according to claim 5, wherein
the first conduction portion includes a P-type diffusion layer whose lower portion is in contact with the first semiconductor layer and whose upper surface is in contact with the lowermost end surface of the first source contact, and
the second conduction portion is the P-type diffusion layer whose lower portion is in contact with the second semiconductor layer and whose upper surface is in contact with the lowermost end surface of the second source contact.

9. A nonvolatile semiconductor memory comprising a first NAND string and a second NAND string,
the first NAND string including first memory cell transistors and paired first selection transistors, the first memory cell transistors being connected together in series and each including a first control gate electrode formed on a main surface of a first semiconductor layer of a first conductivity type with a first electric charge accumulating portion being interposed in between, the paired first selection transistors being connected to endmost ones of the first memory cell transistors, respectively,
the second NAND string including second memory cell transistors and paired second selection transistors, the second memory cell transistors being connected together in series and each including a second control gate electrode formed on a main surface of a second semiconductor layer of the first conductivity type with a second electric charge accumulating portion being interposed in between, the paired second selection transistors connected to endmost ones of the second memory cell transistors, respectively, the second semiconductor layer being formed on the first semiconductor layer with an insulating film being interposed in between in an area other than that in which the first semiconductor layer is formed, the insulating film being thicker than the first electric charge accumulating portion, wherein
the first control gate electrode and the second control gate electrode are formed of a single body, and a first selection gate electrode of the first selection transistor and a second selection gate electrode of the second selection transistor are formed of a single body.

10. The nonvolatile semiconductor memory according to claim 9, wherein
first, second and third voltages, the conductivity type of any one of the first and second semiconductor layers, and a concentration of an impurity of any one of the first and second semiconductor layers are determined in a way that
when data is written to or read from a first memory cell transistor which is selected out of the first memory cell transistors constituting the first NAND string, the first voltage is applied to a drain and a source of the first selection transistor, the second voltage is applied to the gate electrode of the first selection transistor, and the third voltage is applied to the control gate electrodes of the unselected first memory cell transistors, and thereby, the first voltage is transmitted to the selected first memory cell transistor, and when data is written to or read from a second memory cell transistor which is selected out of the second memory cell transistors constituting the second NAND string, the first voltage is applied to a drain and a source of the second selection transistor, the second voltage is applied to the gate electrode of the second selection transistor, and the third voltage is applied to the control gate electrodes of the unselected second memory cell transistors, and thereby, the first voltage is transmitted to the selected second memory cell transistor.

11. A nonvolatile semiconductor memory comprising:
a first semiconductor layer having a first stripe-shaped region and a second stripe-shaped region which is adjacent to the first stripe-shaped region;
a first NAND string formed on the first stripe-shaped region, the first NAND string having a plurality of first memory cell transistors connected in series;
a first insulating film formed above the second stripe-shaped region;
a second semiconductor layer formed on the first insulating film; and
a second NAND string formed on the second semiconductor layer, the second NAND string having a plurality of second memory cell transistors connected in series, wherein
each of the first memory cell transistors has a first electric charge accumulating film and a first control gate formed on the first electric charge accumulating film;
each of the second memory cell transistors has a second electric charge accumulating film and a second control gate formed on the second electric charge accumulating film; and
the first insulating film is thicker than the first electric charge accumulating film.

12. The nonvolatile semiconductor memory according to claim 11, wherein
the first NAND string further has a first and a second selection transistors, the first selection transistor being connected to one end of the serially connected first memory cell transistors and the second selection transistor being connected to the other end of the serially connected first memory cell transistors; and
the second NAND string further has a third and a fourth selection transistors, the third selection transistor being connected to one end of the serially connected second memory cell transistors and the fourth selection transistor being connected to the other end of the serially connected second memory cell transistors.

13. The nonvolatile semiconductor memory according to claim 11, wherein
the first semiconductor layer is a first conductivity type; and
the second semiconductor layer is the first conductivity type.

14. The nonvolatile semiconductor memory according to claim 13, wherein
each of the first memory cell transistors has first source/drain diffusion layers of a second conductivity type; and
each of the second memory cell transistors has second source/drain diffusion layers of a second conductivity type.

15. The nonvolatile semiconductor memory according to claim 11, wherein
the second semiconductor layer is single crystal.

16. The nonvolatile semiconductor memory according to claim 11, wherein
the first semiconductor layer is a semiconductor substrate.

17. The nonvolatile semiconductor memory according to claim 11, further comprising:
- a semiconductor substrate; and
- a second insulating film formed on the semiconductor substrate, wherein
the first semiconductor layer is formed on the second insulating film.

18. The nonvolatile semiconductor memory according to claim 12, further comprising:
- a first source contact connected to a source diffusion layer of the first selection transistor and connected to the first semiconductor layer; and
- a second source contact connected to a source diffusion layer of the third selection transistor and connected to the second semiconductor layer.

19. The nonvolatile semiconductor memory according to claim 18, further comprising:
- an interlayer dielectric formed over the first NAND string and the second NAND string, the interlayer dielectric having a first contact hole exposing the source diffusion layer of the first selection transistor and a second contact hole exposing the source diffusion layer of the third selection transistor, wherein
the first source contact is filled in the first contact hole; and
the second source contact is filled in the second contact hole.

* * * * *